United States Patent
Kido et al.

(10) Patent No.: US 10,292,262 B2
(45) Date of Patent: *May 14, 2019

(54) REINFORCING-PLATE-INTEGRATED FLEXIBLE PRINTED CIRCUIT BOARD

(71) Applicant: Kaneka Corporation, Osaka (JP)

(72) Inventors: Masayoshi Kido, Shiga (JP); Yoshihide Sekito, Shiga (JP)

(73) Assignee: KANEKA CORPORATION, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/414,839

(22) PCT Filed: Jul. 18, 2013

(86) PCT No.: PCT/JP2013/069478
§ 371 (c)(1),
(2) Date: Jan. 14, 2015

(87) PCT Pub. No.: WO2014/014043
PCT Pub. Date: Jan. 23, 2014

(65) Prior Publication Data
US 2015/0189740 A1    Jul. 2, 2015

(30) Foreign Application Priority Data
Jul. 18, 2012   (JP) .................. 2012-159938

(51) Int. Cl.
*H05K 1/02*   (2006.01)
*H05K 1/03*   (2006.01)
(Continued)

(52) U.S. Cl.
CPC ........... *H05K 1/0281* (2013.01); *C09D 5/004* (2013.01); *C09D 7/61* (2018.01); *H05K 1/0373* (2013.01);
(Continued)

(58) Field of Classification Search
CPC .................... H05K 1/0281; H05K 1/0393
(Continued)

(56) References Cited

U.S. PATENT DOCUMENTS 4,472,543 A * 9/1984 Tsuchiya .......... H04R 7/02
181/169
2004/0025743 A1* 2/2004 Wakizaka .......... C09D 5/18
106/18.11
(Continued)

FOREIGN PATENT DOCUMENTS

JP     2002-294131    10/2002
JP     2004-95566     3/2004
(Continued)

OTHER PUBLICATIONS

International Search Report, PCT/JP2013/069478, dated Mar. 9, 2013.
(Continued)

*Primary Examiner* — Stanley Tso
(74) *Attorney, Agent, or Firm* — Kagan Binder, PLLC

(57) ABSTRACT

The present invention provides a stiffener-integrated flexible printed circuit board that has excellent electrical insulation reliability and that prevents the stiffener from being detached during a reflow process. The stiffener-integrated flexible printed circuit board including: (A) a stiffener, (B) a thermosetting adhesive, (C) an insulator film, and (D) a wiring-pattern-equipped film, (A) the stiffener, (B) the thermosetting adhesive, (C) the insulator film, and (D) the wiring-pattern-equipped film being laminated in this order, (C) the insulator film containing at least (a) a binder polymer and (b) a black coloring agent having a reflective range within the infrared range.

6 Claims, 1 Drawing Sheet

(51) Int. Cl.
*C09D 5/33* (2006.01)
*C09D 7/61* (2018.01)
*C08K 3/22* (2006.01)

(52) U.S. Cl.
CPC .............. *C08K 3/22* (2013.01); *H05K 1/0274* (2013.01); *H05K 2201/012* (2013.01); *H05K 2201/2054* (2013.01)

(58) Field of Classification Search
USPC ........................................................ 174/254
See application file for complete search history.

(56) References Cited

U.S. PATENT DOCUMENTS

| | | | |
|---|---|---|---|
| 2004/0044146 A1* | 3/2004 | Gunji | C08G 59/3218 525/523 |
| 2005/0165209 A1 | 7/2005 | Kurita et al. | |
| 2006/0090928 A1* | 5/2006 | Fujii | H05K 1/028 174/254 |
| 2006/0293498 A1 | 12/2006 | Kurita et al. | |
| 2008/0097046 A1* | 4/2008 | Tokiwa | C08G 59/182 525/523 |
| 2009/0088495 A1 | 4/2009 | Mikami et al. | |
| 2009/0133739 A1* | 5/2009 | Shiao | H01L 31/048 136/251 |
| 2010/0119805 A1* | 5/2010 | Gunji | C08G 59/1422 428/292.1 |
| 2010/0148312 A1* | 6/2010 | Jung | H01L 21/6835 257/619 |
| 2010/0208442 A1* | 8/2010 | Asano | H01L 21/563 361/783 |
| 2011/0061928 A1 | 3/2011 | Hasegawa | |
| 2011/0247683 A1* | 10/2011 | Watanabe | H01L 31/048 136/251 |
| 2012/0061128 A1* | 3/2012 | Ito | C08G 8/30 174/255 |
| 2013/0011645 A1* | 1/2013 | Carney | B32B 27/08 428/220 |
| 2013/0183499 A1 | 7/2013 | Kido et al. | |
| 2013/0286609 A1 | 10/2013 | Merz | |
| 2015/0044451 A1 | 2/2015 | Kido et al. | |

FOREIGN PATENT DOCUMENTS

| | | | |
|---|---|---|---|
| JP | 2007-294918 | 11/2007 | |
| JP | 2008-257045 | 10/2008 | |
| JP | 2009-290103 | 12/2009 | |
| JP | 2010-06921 | 1/2010 | |
| JP | 2010-13558 | 1/2010 | |
| JP | 2010-114185 | 5/2010 | |
| JP | 2011-61070 | 3/2011 | |
| JP | 5639284 B2 | 12/2014 | |
| SG | 184257 A1 | 11/2012 | |
| TW | 200803664 * | 1/2008 | ............... H05K 3/28 |
| TW | 320046 B | 2/2010 | |
| TW | 201207968 A1 | 2/2012 | |
| WO | 2012/035857 | 3/2012 | |

OTHER PUBLICATIONS

International Preliminary Report on Patentability, PCT/JP2013/069478, dated Jan. 29, 2015.
International Search Report, PCT/JP2013/069479, dated Sep. 3, 2013.
International Preliminary Report on Patentability, PCT/JP2013/069479, dated Jan. 29, 2015.
Non-Final Office Action from copending U.S. Appl. No. 14/414,846, dated Nov. 25, 2015.
Office Action and English Translation of Office Action for Taiwanese Patent Application No. 102125635, dated Jun. 27, 2016 (9 pages).
Final Office Action from copending U.S. Appl. No. 14/414,846, dated Jul. 28, 2016.
Non-Final Office Action from copending U.S. Appl. No. 14/414,846, dated Apr. 14, 2016.
Advisory Action from copending U.S. Appl. No. 14/414,846, dated Oct. 17, 2016.
Advisory Action from copending U.S. Appl. No. 14/414,846, dated Dec. 7, 2016.
Non-Final Office Action for co-pending U.S. Appl. No. 15/629,504, dated Dec. 11, 2017 (13 pages).

* cited by examiner

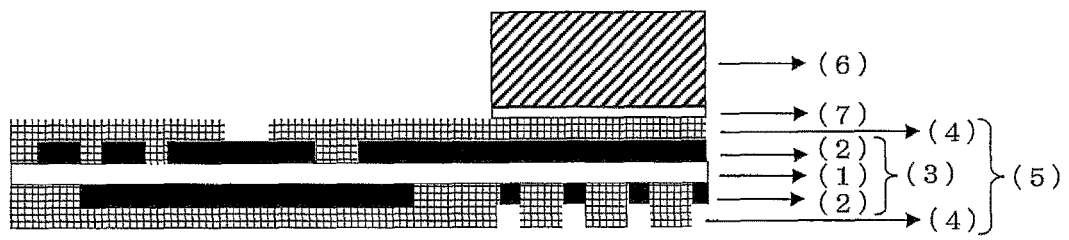

REINFORCING-PLATE-INTEGRATED FLEXIBLE PRINTED CIRCUIT BOARD

This application claims benefit from International Application No. PCT/JP2013/069478, which was filed on Jul. 18, 2013, which in turn claims priority to Japanese Application No. 2012-159938, which was filed on Jul. 18, 2012, wherein the entireties of said patent applications are incorporated herein by reference.

TECHNICAL FIELD

The present invention relates to a stiffener-integrated flexible printed circuit board. More specifically, the present invention relates to a stiffener-integrated flexible printed circuit board that has excellent electrical insulation reliability and that prevents the stiffener from being detached during a reflow process.

BACKGROUND ART

Recent years have seen rapid reductions in the size and weight of electronic devices such as mobile telephones, video cameras, and laptop personal computers. This development essentially requires flexible printed circuit boards, which are soft printed circuit boards with flexibility. A flexible printed circuit board is a wiring board that has a thickness of several tens to several hundreds of micrometers and that has high bendability. A flexible printed circuit board thus needs reinforcing for areas in which to mount components such as a connector in order to ensure strength necessary for such mounting. In view of this, a flexible printed circuit board is normally provided with a stiffener fixed with use of a thermosetting adhesive to a surface opposite to the component mounting areas. This can locally improve the strength of the flexible printed circuit board (see, for example, Patent Literatures 1 to 3).

A flexible printed circuit board is also provided with an insulator film serving as a surface protecting material. Regarding such an insulator film, there has been a technique of giving the black color to an insulator film to impart concealment property to the insulator film, thereby concealing the circuit pattern to protect confidential information included in the circuit pattern (see, for example, Patent Literatures 4 and 5).

CITATION LIST

Patent Literature 1
Japanese Patent Application Publication, Tokukai, No. 2010-114185 A
Patent Literature 2
Japanese Patent Application Publication, Tokukai, No. 2010-6921 A
Patent Literature 3
Japanese Patent Application Publication, Tokukai, No. 2011-61070 A
Patent Literature 4
Japanese Patent Application Publication, Tokukai, No. 2008-257045 A
Patent Literature 5
Japanese Patent Application Publication, Tokukai, No. 2002-294131 A

SUMMARY OF INVENTION

Technical Problem

Patent Literature 1 particularly discusses a stiffener having sufficient heat resistance (solder heat resistance), and describes a stiffener suitably usable for a circuit connection part or mounting part of a flexible printed circuit board. Patent Literature 2 particularly discusses a thermosetting adhesive, and describes an adhesive composition and an adhesive sheet that are excellent in storage stability, adhesiveness, solder heat resistance, and workability. The above stiffener and thermosetting adhesive are, however, individual elements of a stiffener-integrated flexible printed circuit board. Merely improving the properties of the individual elements, that is, a stiffener and a thermosetting adhesive, will not satisfy properties desired for a stiffener-integrated flexible printed circuit board. For instance, a stiffener-integrated flexible printed circuit board will not exhibit good properties without improvement in adhesiveness between its flexible printed circuit board and thermosetting adhesive.

Patent Literature 3 particularly discusses a cover film layer, which is the outermost layer of a flexible printed circuit board, and describes a flexible printed wiring board including a cover film layer having a groove, thereby increasing the area of adhesion of an adhesive for bonding the flexible printed circuit board to the stiffener for improved adhesion strength. Patent Literature 3, however, proposes processes such as sandblasting, embossing, and plasma treatment as a method for forming a groove in a cover film layer, possibly increasing the production cost.

In view of the above problems, the inventors of the present invention have focused on an insulator film, which is the outermost layer of a flexible printed circuit board, and have diligently researched on a stiffener-integrated flexible printed circuit board.

The techniques disclosed in Patent Literatures 4 and 5 are each intended to provide a black, photo-curable insulator film with high resolution, and are not intended to improve adhesiveness between a black insulator film and a stiffener. The techniques of Patent Literatures 4 and 5 thus pose the following problem (hereinafter referred to as "reflow heat resistance"): In the case where a stiffener has been bonded to the black insulator film, the stiffener may be detached from the black insulator film during a reflow process, in which components are mounted on a flexible printed circuit board including the stiffener bonded.

Solution to Problem

The inventors of the present invention have conducted diligent research to solve the above problem, and have consequently discovered that a stiffener-integrated flexible printed circuit board including: (A) a stiffener; (B) a thermosetting adhesive; (C) an insulator film; and (D) a wiring-pattern-equipped film, (A) the stiffener, (B) the thermosetting adhesive, (C) the insulator film, and (D) the wiring-pattern-equipped film being laminated in this order, (C) the insulator film containing at least (a) a binder polymer and (b) a black coloring agent having a reflective range within an infrared range, has excellent electrical insulation reliability and prevents the stiffener from being detached during a reflow process. The inventors have arrived at the present invention on the basis of such knowledge. The present invention provides a stiffener-integrated flexible printed circuit board described below to solve the above problem.

In other words, the present invention provides a stiffener-integrated flexible printed circuit board including: (A) a stiffener; (B) a thermosetting adhesive; (C) an insulator film; and (D) a wiring-pattern-equipped film, (A) the stiffener, (B) the thermosetting adhesive, (C) the insulator film, and (D) the wiring-pattern-equipped film being laminated in this order, (C) the insulator film containing at least (a) a binder polymer and (b) a black coloring agent having a reflective range within an infrared range.

Advantageous Effects of Invention

A stiffener-integrated flexible printed circuit board of the present invention is, as described above, a stiffener-integrated flexible printed circuit board including: (A) a stiffener; (B) a thermosetting adhesive; (C) an insulator film; and (D) a wiring-pattern-equipped film, (A) the stiffener, (B) the thermosetting adhesive, (C) the insulator film, and (D) the wiring-pattern-equipped film being laminated in this order, (C) the insulator film containing at least (a) a binder polymer and (b) a black coloring agent having a reflective range within an infrared range. This arrangement allows the stiffener-integrated flexible printed circuit board of the present invention to have excellent electrical insulation reliability and prevent the stiffener from being detached during a reflow process.

BRIEF DESCRIPTION OF DRAWINGS

FIG. 1 is a diagram illustrating the structure of a stiffener-integrated flexible printed circuit board.

DESCRIPTION OF EMBODIMENTS

An embodiment of the present invention is described below in detail. All academic and patent documents cited in the present specification are incorporated herein by reference. Further, any numerical range "A to B" expressed in the present specification means "not less than A and not greater than B" unless otherwise stated.

The description below deals in detail with the present invention.

A stiffener-integrated flexible printed circuit board of the present invention may be a stiffener-integrated flexible printed circuit board including: (A) a stiffener, (B) a thermosetting adhesive, (C) an insulator film, and (D) a wiring-pattern-equipped film, (A) the stiffener, (B) the thermosetting adhesive, (C) the insulator film, and (D) the wiring-pattern-equipped film being laminated in this order, (C) the insulator film containing at least (a) a binder polymer and (b) a black coloring agent having a reflective range within the infrared range.

As the inventors of the present invention have discovered, a stiffener-integrated flexible printed circuit board of the present invention has various excellent properties. This seems to be for the following reason:

There is a problem with a stiffener-integrated flexible printed circuit board including (i) a black insulator film made of a black resin composition and (ii) a stiffener bonded onto the black insulator film. Specifically, the stiffener may be detached from the insulator film during a reflow process. This problem is one that the inventors of the present invention newly encountered when diligently researching on a stiffener-integrated flexible printed circuit board including a black insulator film. The problem presumably arises as follows: The heating method in the reflow processes is the method with the use of an infrared heater. The infrared radiation is absorbed by a black coloring agent contained in the black insulator film. This absorption raises the surface temperature of the black insulator film to its decomposition temperature. This temperature rise then generates a large amount of outgas. The generation of a large amount of outgas eventually causes the stiffener to be detached from the surface of the insulator film. The inventors of the present invention presume that using the component (b) of the present invention, that is, a black coloring agent having a reflective range within the infrared range, can prevent outgas from being generated during a reflow process. The inventors of the present invention further presume that since the black coloring agent serving as the component (b) of the present invention is more insulating than typical black coloring agents such as carbon black, a stiffener-integrated flexible printed circuit board including the black coloring agent serving as the component (b) has excellent electrical insulation reliability as well.

The description below deals with (A) the stiffener, (B) the thermosetting adhesive, (C) the insulator film, (D) the wiring-pattern-equipped film, and other components in addition to the stiffener-integrated flexible printed circuit board itself.

<Stiffener-Integrated Flexible Printed Circuit Board>

FIG. 1 is a diagram illustrating the structure of a stiffener-integrated flexible printed circuit board of the present invention. Note that the present invention is not limited to the arrangement illustrated. This stiffener-integrated flexible printed circuit board of the present invention can be produced by first forming (C) an insulator film (4) on each of upper and lower surfaces of (D) a wiring-pattern-equipped film (3) including a base film (1) and wiring patterns (2) to prepare a flexible printed circuit board (5) and then forming (A) a stiffener (6) on (C) the insulator film (4) formed on the upper surface of the film (3) with (B) a thermosetting adhesive (7) between that insulator film (4) and the stiffener (6).

<(A) Stiffener>

(A) The stiffener of the present invention is simply required to be made of a material usable to reinforce a flexible printed circuit board. The material is thus not limited to any particular one. The material of (A) the stiffener may, however, vary according to how the flexible printed circuit board is to be used. (A) The stiffener may be, for example, a thick stiffener or thin stiffener. Examples of the thick stiffener include a paper phenol plate and a glass epoxy plate. Examples of the thin stiffener include a polyimide film and a polyester film. Other examples of the thin stiffener include a metal plate such as a copper plate and an aluminum plate. The use of a polyimide film for the stiffener allows production of a stiffener-integrated flexible printed circuit board that is excellent in heat resistance and plasticity. The polyimide film can be a polyimide film selected as appropriate. The polyimide film, however, preferably has a thickness of 75 μm to 225 μm, and is, for example, the product named Apical 125NPI available from Kaneka Corporation (with a thickness of 125 μm). If the polyimide film has a thickness of less than 75 μm, (A) the stiffener may fail to have strength necessary to support (D) the wiring-pattern-equipped film. If the polyimide film has a thickness of greater than 225 μm, the stiffener-integrated flexible printed circuit board may have excessively large thickness as a whole and fail to meet the demand for downsizing and weight reduction.

<(B) Thermosetting Adhesive>

(B) The thermosetting adhesive of the present invention is simply required to be a typical thermosetting adhesive, and can be a thermosetting adhesive selected as appropriate. (B) The thermosetting adhesive can be, for example, an epoxy thermosetting adhesive, an acrylic thermosetting adhesive, or an acrylic/epoxy thermosetting adhesive. Examples of the epoxy thermosetting adhesive include the products named D3410 and D3411 available from Sony Chemical & Information Device Corporation. Examples of the acrylic thermosetting adhesive include the products named Pyralux LF0100 and Pyralux FR0100 available from Du Pont Kabushiki Kaisha. Examples of the acrylic/epoxy thermosetting adhesive include the products named D3450 and D3451 available from Sony Chemical & Information Device Corporation.

The method for processing (B) the thermosetting adhesive of the present invention is not limited to any particular one. An example of the method is a pressure and heat molding method with the use of a thermal press. Further, the conditions for the pressure and heat molding method with the use of a thermal press are not limited to any particular ones. The thermosetting adhesive can be processed through heat and pressure molding at, for example, a thermal-press temperature of 100 to 180° C. and a thermal-press pressure of 0.5 to 5.0 kgf/cm² for a thermal-press time of 10 to 90 minutes. The conditions for the pressure and heat molding are preferably controlled to be within the above ranges for improved adhesiveness between the stiffener and the insulator film.

<(C) Insulator Film>

(C) The insulator film of the present invention is an insulating film having a thickness of 5 to 100 μm, and is produced by curing a resin composition.

The thickness of (C) the insulator film of the present invention may be measured through any method. The thickness can be measured through, for example, a method conforming to JIS K 5400 3.5.

The thickness of the insulator film is preferably controlled to be within the above range for excellent electrical insulation reliability of (C) the insulator film. If the insulator film has a thickness of less than 5 μm, (C) the insulator film may have poor electrical insulation reliability. If the insulator film has a thickness of greater than 100 μm, (C) the insulator film may have poor plasticity.

(C) The insulator film of the present invention preferably contains at least (a) a binder polymer and (b) a black coloring agent having a reflective range within the infrared range. (C) The insulator film preferably contains the component (b) because that blackens (C) the insulator film to prevent the stiffener from being detached during a reflow process and also allows production of a stiffener-integrated flexible printed circuit board having electrical insulation reliability.

[(a) Binder Polymer]

(a) The binder polymer of the present invention is a polymer that is soluble in an organic solvent and that has an weight average molecular weight of 1,000 or greater and 1,000,000 or less in terms of polyethylene glycol.

The organic solvent is not limited to any particular one. Examples of the organic solvent include a sulfoxide solvent such as dimethyl sulfoxide and diethyl sulfoxide, a formamide solvent such as N,N-dimethyl formamide and N,N-diethyl formamide, an acetamide solvent such as N,N-dimethyl acetamide and N,N-diethyl acetamide, a pyrrolidone solvent such as N-methyl-2-pyrrolidone and N-vinyl-2-pyrrolidone, hexamethylphosphoramide, and γ-butyrolactone. Any of these organic polar solvents can be used in combination with an aromatic hydrocarbon such as xylene and toluene where necessary.

Examples of the organic solvent further include solvents of (i) a symmetric glycol diether such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether), (ii) an acetate such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (also known as carbitol acerate or 2-(2-butoxyethoxyl)ethyl acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate, and (iii) an ether such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, and ethylene glycol monoethyl ether.

Whether a binder polymer is soluble in an organic solvent is determined on the basis of the index called organic solvent solubility. The organic solvent solubility can be measured by measuring parts by weight of that portion of the binder polymer which is dissolved in 100 parts by weight of an organic solvent. If 5 or more parts by weight of the binder polymer are dissolved in 100 parts by weight of the organic solvent, the binder polymer can be regarded as soluble in the organic solvent. The method for measuring organic solvent solubility is not limited to any particular one. An example method is as follows: First, 5 parts by weight of the binder polymer are added to 100 parts by weight of an organic solvent. Next, the mixture is stirred at 40° C. for 1 hour. Then, the mixture is cooled to room temperature (25° C.) and let stand for 24 hours or longer. The resulting mixture is observed to check whether it is a homogeneous solution free of any insoluble matter or precipitate. If it is such a homogeneous solution, the binder polymer can be regarded as soluble in the organic solvent.

The weight average molecular weight of the component (a) of the present invention can be measured under, for example, the following measurement conditions:

(Weight Average Molecular Weight Measurement)

Apparatus used: Equivalent of HLC-8220GPC available from Tosoh Corporation

Column: TSK gel Super AWM-H (available from Tosoh Corporation, 6.0 mm I.D.×15 cm)×2

Guard column: TSK guard column Super AW-H available from Tosoh Corporation

Eluant: 30 mM LiBr+20 mM H3PO4 in DMF

Flow rate: 0.6 mL/min

Column temperature: 40° C.

Detection condition: RI: polarity (+), response (0.5 sec)

Sample concentration: Approximately 5 mg/mL

Standard preparation: PEG (polyethylene glycol)

The present invention is arranged such that the component (a) has a weight average molecular weight controlled to be within the range of 1,000 or greater and 1,000,000 or less in terms of polyethylene glycol. This arrangement is preferable as it allows (C) an insulator film produced to be excellent in plasticity and chemical resistance. If the component (a) has a weight average molecular weight of less than 1,000, (C) the insulator film may be poor in plasticity and chemical resistance. If the component (a) has a weight average molecular weight of greater than 1,000,000, the resin composition may have high viscosity.

The component (a) of the present invention is not limited to any particular one. Examples of the component (a) include a polyurethane resin, a poly(meth)acrylic resin, a polyvinyl resin, a polystyrene resin, a polyethylene resin, a polypropylene resin, a polyimide resin, a polyamide resin, a polyacetal resin, a polycarbonate resin, a polyester resin, a polyphenylene ether resin, a polyphenylene sulfide resin, a polyether sulfone resin, and a polyether ether ketone resin. Any of these resins may be used alone, or two or more of them may be used in combination. The component (a) of the present invention is preferably, among others, a resin containing a urethane bond within the molecule such as a polyurethane resin and a poly(meth)acrylic resin for improved plasticity and improved folding endurance in (C) the insulator film and for reduced warpage in (C) the insulator film.

The polyurethane resin, that is, the resin of the present invention containing a urethane bond within the molecule, is a polymer that is soluble in an organic solvent, that contains within the molecule a repeating unit containing at least one urethane bond, and that has a weight average molecular weight of 1,000 or greater and 1,000,000 or less in terms of polyethylene glycol.

The polyurethane resin, that is, the resin of the present invention containing a urethane bond within the molecule, can be produced through any reaction. For instance, through a reaction between (i) a diol compound represented by the following General Formula (1):

[Chem. 1]

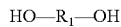   General Formula (1)

where $R_1$ is a bivalent organic group, and (ii) a diisocyanate compound represented by the following General Formula (2):

[Chem. 2]

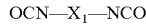   General Formula (2)

where $X_1$ is a bivalent organic group, the polyurethane resin is produced as the structure containing within the molecule a repeating unit containing a urethane bond, the repeating unit being represented by the following General Formula (3):

[Chem. 3]

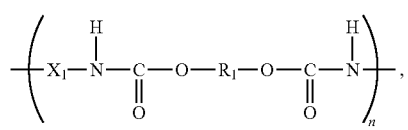

General Formula (3)

where $R_1$ and $X_1$ are each independently a bivalent organic group, and n is an integer of 1 or greater.

The diol compound of the present invention is not limited to any particular one as long as it has the structure represented by General Formula (1). Examples of the diol compound include an alkylene diol such as ethylene glycol, diethylene glycol, propylene glycol, 1,3-butandiol, 1,4-butandiol, 1,5-pentanediol, neopentyl glycol, 3-methyl-1,5-pentanediol, 1,6-hexanediol, 1,7-heptane diol, 1,8-octane diol, 2-methyl-1,8-octane diol, 1,9-nonanediol, 1,10-decane diol, 1,4-cyclohexanediol, and 1,4-cyclohexane dimethanol; a polyoxyalkylene diol such as polyethylene glycol, polypropylene glycol, polytetramethylene glycol, and a random copolymer of tetramethylene glycol and neopentyl glycol; a polyester diol produced through a reaction between a polyhydric alcohol and a polybasic acid; a polycarbonate diol containing a carbonate skeleton; a polycaprolactone diol produced through an open-ring addition reaction of a lactone such as γ-butyl lactone, ε-caprolactone, and δ-valerolactone; bisphenol A; an ethylene oxide adduct of bisphenol A; a propylene oxide adduct of bisphenol A; hydrogenated bisphenol A; an ethylene oxide adduct of hydrogenated bisphenol A; and a propylene oxide adduct of hydrogenated bisphenol A. Any of these diol compounds may be used alone, or two or more of them may be used in combination.

The diol compound of the present invention is preferably, among others, a long-chain diol such as polyethylene glycol, polypropylene glycol, polytetramethylene glycol, polyoxyalkylene diol, polyester diol, polycarbonate diol, and polycaprolactone diol for reduced elasticity modulus of (C) the insulator film, for improved plasticity and improved folding endurance, and for reduced warpage in the insulator film.

The diisocyanate compound of the present invention is not limited to any particular one as long as it has the structure represented by General Formula (2). Examples of the diisocyanate compound include (i) an aromatic diisocyanate compound such as diphenylmethane-2,4'-diisocyanate, 3,2'-dimethyl diphenylmethane-2,4'-diisocyanate, 3,3'-dimethyl diphenylmethane-2,4'-diisocyanate, 4,2'-dimethyl diphenylmethane-2,4'-diisocyanate, 4,3'-dimethyl diphenylmethane-2,4'-diisocyanate, 5,2'-dimethyl diphenylmethane-2,4'-diisocyanate, 5,3'-dimethyl diphenylmethane-2,4'-diisocyanate, 6,2'-dimethyl diphenylmethane-2,4'-diisocyanate, 6,3'-dimethyl diphenylmethane-2,4'-diisocyanate, 3,2'-diethyl diphenylmethane-2,4'-diisocyanate, 3,3'-diethyl diphenylmethane-2,4'-diisocyanate, 4,2'-diethyl diphenylmethane-2,4'-diisocyanate, 4,3'-diethyl diphenylmethane-2,4'-diisocyanate, 5,2'-diethyl diphenylmethane-2,4'-diisocyanate, 5,3'-diethyl diphenylmethane-2,4'-diisocyanate, 6,2'-diethyl diphenylmethane-2,4'-diisocyanate, 6,3'-diethyl diphenylmethane-2,4'-diisocyanate, 3,2'-dimethoxy diphenylmethane-2,4'-diisocyanate, 3,3'-dimethoxy diphenylmethane-2,4'-diisocyanate, 4,2'-dimethoxy diphenylmethane-2,4'-diisocyanate, 4,3'-dimethoxy diphenylmethane-2,4'-diisocyanate, 5,2'-dimethoxy diphenylmethane-2,4'-diisocyanate, 5,3'-dimethoxy diphenylmethane-2,4'-diisocyanate, 6,2'-dimethoxy diphenylmethane-2,4'-diisocyanate, 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenyl ether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate, (ii) an alicyclic diisocyanate compound such as hydrogenated diphenylmethane diisocyanate, hydrogenated xylylene diisocyanate, isophorone diisocyanate, and norbornene diisocyanate, and (iii) an aliphatic diisocyanate compound such as hexamethylene diisocyanate, trimethyl hexamethylene diisocyanate, and lysine diisocyanate. Any of these diisocyanate compounds may be used alone, or two or more of them may be used in combination.

The polyurethane resin, that is, the resin of the present invention containing a urethane bond within the molecule, is synthesized through a method of (i) mixing the diol compound and the diisocyanate compound in such respective amounts that the ratio of the number of hydroxyl groups to the number of isocyanate groups (isocyanate group/hydroxyl group) is 0.5 or greater and 2.0 or less and (ii) reacting the diol compound with the diisocyanate compound in the absence of a solvent or in an organic solvent.

In the case where the polyurethane resin, that is, the resin of the present invention containing a urethane bond within the molecule, is synthesized through a method with the use of two or more diol compounds, the diisocyanate compound may be reacted with (i) the two or more diol compounds after the diol compounds are mixed with each other or (ii) each of the diol compounds separately. Another method is (i) reacting a diol compound with a diisocyanate compound, (ii) further reacting a terminal isocyanate group of the resulting resin with another diol compound, and (iii) still further reacting the reaction product with a diisocyanate compound. This applies also to a case with the use of two or more diisocyanate compounds. Any of the methods described above allows production of a desired polyurethane resin containing a urethane bond within the molecule.

The diol compound and the diisocyanate compound are reacted with each other preferably at a temperature of 40 to 160° C., more preferably at a temperature of 60 to 150° C. If the temperature is lower than 40° C., the reaction time will be excessively long. If the temperature is higher than 160° C., a three-dimensional reaction is likely to occur during the reaction to result in gelatinization. The duration of the reaction between the diol compound and the diisocyanate compound can be selected as appropriate depending on the scale of a batch or conditions to be set for the reaction. Further, the reaction may be performed in the presence of a catalyst such as a tertiary amine, an alkali metal, an alkali earth metal, a metal (for example, tin, zinc, titanium, or cobalt), or a semimetal compound where necessary.

The diol compound and the diisocyanate compound can be reacted with each other in the absence of a solvent. These compounds are, however, desirably reacted with each other in an organic solvent system for control of the reaction. The organic solvent for use in the reaction is not limited to any particular one, and can be any of the examples listed above.

The organic solvent for the reaction between the diol compound and the diisocyanate compound is used desirably in such an amount that the solute concentration by weight of the reaction solution, that is, the concentration of the reaction solution, is 5% by weight or higher and 90% by weight or lower. The solute concentration by weight of the reaction solution is more preferably 10% by weight or higher and 80% by weight or lower. A solution concentration of lower than 5% by weight is not preferable because such a low concentration will not only fail to allow a polymerization reaction to occur easily and decrease the reaction speed, but also may fail to produce a desired structural substance. If the solution concentration is higher than 90% by weight, the reaction solution may have high viscosity, with the result of a non-uniform reaction.

The polyurethane resin of the present invention containing a urethane bond within the molecule preferably further contains at least one organic group selected from the group consisting of a (meth)acryloyl group, a carboxyl group, and an imide group. The term "(meth)acryloyl group" as used herein refers to an acryloyl group and/or methacryloyl group. In the case where the polyurethane resin further contains a (meth)acryloyl group, the resin composition will have improved photosensitivity, making it possible to cure the polyurethane resin through a short time period of ultraviolet irradiation. In the case where the polyurethane resin further contains a carboxyl group, the resin composition will have improved solubility in a dilute alkaline aqueous solution serving as a developer for use in to form a fine pattern, making it possible to form a fine pattern through a short time period of development. In the case where the polyurethane resin further contains an imide group, (C) the insulator film will have improved heat resistance as well as improved electrical insulation reliability under high-temperature, high-humidity conditions.

The polyurethane resin containing a urethane bond within the molecule and a (meth)acryloyl group can be produced through any reaction. Such a polyurethane resin can be produced by reacting, for instance, the diol compound and the diisocyanate compound with (i) a compound containing a hydroxyl group and at least one (meth)acryloyl group, the compound being represented by the following General Formula (4):

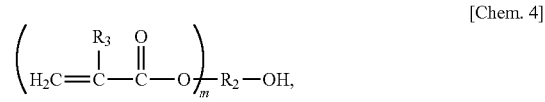

General Formula (4)

where $R_2$ is an organic group having a valence of m+1, $R_3$ is a hydrogen or alkyl group, and m is an integer of 1 to 3, and/or (ii) a compound containing an isocyanate group and at least one (meth)acryloyl group, the compound being represented by the following General Formula (5):

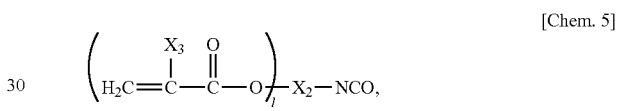

General Formula (5)

where $X_2$ is an organic group having a valence of 1+1, $X_3$ is a hydrogen or alkyl group, and l is an integer of 1 to 3.

The compound of the present invention containing a hydroxyl group and at least one (meth)acryloyl group is not limited to any particular one as long as it has the structure represented by General Formula (4). Examples of the compound include 2-hydroxyethyl(meth)acrylate, 2-hydroxypropyl(meth)acrylate, 2-hydroxybutyl(meth)acrylate, 2-hydroxy-3-phenoxypropyl(meth)acrylate, 2-hydroxy-1-acryloxy-3-methacryloxypropane, o-phenylphenolglycidyl ether(meth)acrylate, polyethylene glycol mono(meth)acrylate, pentaerythritol tri(meth)acrylate, tris(2-hydroxyethyl) isocyanurate di(meth)acrylate, 1,4-cyclohexane dimethanol mono(meth)acrylate, 4-hydroxyphenyl(meth)acrylate, 2-(4-hydroxyphenyl)ethyl(meth)acrylate, N-methylolacrylamide, and 3,5-dimethyl-4-hydroxybenzyl acrylamide. Any of these compounds may be used alone, or two or more of them may be used in combination.

The compound of the present invention containing an isocyanate group and at least one (meth)acryloyl group is not limited to any particular one as long as it has the structure represented by General Formula (5). Examples of the compound include 2-(meth)acryloyloxyethyl isocyanate, 1,1-bis(acryloyloxymethyl)ethyl isocyanate, and 2-(2-methacryloyloxyethyloxy)ethyl isocyanate. Any of these compounds may be used alone, or two or more of them may be used in combination.

The polyurethane resin containing a urethane bond within the molecule and a carboxyl group can be produced through any reaction. Such a polyurethane resin can be produced by reacting, for instance, the diol compound and the diisocyanate compound with a compound containing two hydroxyl groups and one carboxyl group, the compound being represented by the following General Formula (6):

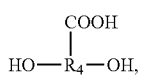

General Formula (6)

where $R_4$ is a trivalent organic group.

The compound of the present invention containing two hydroxyl groups and one carboxyl group is not limited to any particular one as long as it has the structure represented by General Formula (6). Examples of the compound include 2,2-bis(hydroxy methyl)propionic acid, 2,2-bis(2-hydroxyethyl)propionic acid, 2,2-bis(3-hydroxymepropyl)propionic acid, 2,3-dihydroxy-2-methylpropionic acid, 2,2-bis(hydroxy methyl)butanoic acid, 2,2-bis(2-hydroxyethyl)butanoic acid, 2,2-bis(3-hydroxypropyl)butanoic acid, 2,3-dihydroxybutanoic acid, 2,4-dihydroxy-3,3-dimethylbutanoic acid, 2,3-dihydroxy hexadecanoic acid, 2,3-dihydroxy benzoic acid, 2,4-dihydroxy benzoic acid, 2,5-dihydroxy benzoic acid, 2,6-dihydroxy benzoic acid, 3,4-dihydroxy benzoic acid, and 3,5-dihydroxy benzoic acid. Any of these compounds may be used alone, or two or more of them may be used in combination.

In particular, the compound containing two hydroxyl groups and one carboxyl group is preferably an aliphatic compound containing two hydroxyl groups and one carboxyl group for excellent photosensitivity of the photosensitive resin composition.

The polyurethane resin containing a urethane bond within the molecule and an imide group can be produced through any reaction. Such a polyurethane resin can be produced by reacting, for instance, the diol compound and the diisocyanate compound with a tetracarboxylic dianhydride represented by the following General Formula (7):

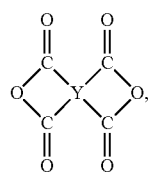

General Formula (7)

where Y is a tetravalent organic group.

The tetracarboxylic dianhydride of the present invention is not limited to any particular one as long as it has the structure represented by General Formula (7). Examples of the tetracarboxylic dianhydride include 3,3',4,4'-benzophenone tetracarboxylic dianhydride, pyromellitic dianhydride, 3,3',4,4'-oxydiphthalic dianhydride, 2,2-bis[4-(3,4-dicarboxyphenoxyl)phenyl]propane dianhydride, 2,2-bis(4-hydroxyphenyl)propane dibenzoate-3,3',4,4'-tetracarboxylic dianhydride, 3,3',4,4'-diphenylsulfone tetracarboxylic dianhydride, 3,3',4,4'-biphenyl tetracarboxylic dianhydride, 2,3,3',4-biphenyl tetracarboxylic dianhydride, and 5-(2,5-dioxotetrahydro-3-furanyl)-3-methyl-3-cyclohexene-1,2-dicarboxylic anhydride. Any of these tetracarboxylic dianhydrides may be used alone, or two or more of them may be used in combination.

The poly(meth)acrylic resin of the present invention is a polymer that is soluble in an organic solvent, that contains a repeating unit produced through copolymerization of a (meth)acrylic acid and/or ester derivative of a (meth)acrylic acid, and that has a weight average molecular weight of 1,000 or greater and 1,000,000 or less in terms of polyethylene glycol. The term "(meth)acrylic" as used herein means "methacrylic and/or acrylic".

The poly(meth)acrylic resin of the present invention can be produced through any reaction, and can be produced by reacting, for instance, a (meth)acrylic acid and/or ester derivative of a (meth)acrylic acid in a solvent in the presence of a radical polymerization initiator.

The ester derivative of a (meth)acrylic acid of the present invention is not limited to any particular one. Examples of the ester derivative include methyl (meth)acrylate, ethyl (meth)acrylate, propyl (meth)acrylate, butyl (meth)acrylate, isobutyl (meth)acrylate, t-butyl (meth)acrylate, hexyl (meth)acrylate, 2-ethylhexyl(meth)acrylate, octyl (meth)acrylate, nonyl (meth)acrylate, decyl (meth)acrylate, dodecyl (meth)acrylate, stearyl (meth)acrylate, and benzyl (meth)acrylate. Any of these ester derivatives may be used alone, or two or more of them may be used in combination. The ester derivative of a (meth)acrylic acid of the present invention is preferably, among others, methyl (meth)acrylate, ethyl (meth)acrylate, or butyl (meth)acrylate for improved plasticity and improved chemical resistance of (C) the insulator film.

Examples of the radical polymerization initiator include an azo compound such as azobisisobutyronitrile, azobis(2-methylbutylonitrile), and 2,2'-azobis-2,4-dimethylvaleronitrile; an organic peroxide such as t-butylhydroperoxide, cumene hydroperoxide, benzoyl peroxide, dicumyl peroxide, and di-t-butyl peroxide; a persulfate such as potassium persulfate, sodium persulfate, and ammonium persulfate; and a hydrogen peroxide. Any of these radical polymerization initiators may be used alone, or two or more of them may be used in combination.

The radical polymerization initiator is used in an amount of preferably 0.001 to 5 parts by weight, more preferably 0.01 to 1 part by weight, with respect to 100 parts by weight of the monomer used. If the radical polymerization initiator is used in an amount of smaller than 0.001 part by weight, the reaction will be hard to proceed. If the radical polymerization initiator is used in an amount of larger than 5 parts by weight, the poly(meth)acrylic resin may have decreased molecular weight.

The solvent for the reaction of synthesizing the poly(meth)acrylic resin is used in such an amount that the solute concentration by weight of the reaction solution, that is, the concentration of the reaction solution, is 5% by weight or higher and 90% by weight or lower, more preferably 20% by weight or higher and 70% by weight or lower. A solution concentration of lower than 5% by weight will not only (i) fail to allow a polymerization reaction to occur easily and (ii) decrease the reaction speed, but also may fail to produce a desired structural substance. If the solution concentration is higher than 90% by weight, the reaction solution may have high viscosity, with the result of a non-uniform reaction.

The poly(meth)acrylic resin is synthesized in a reaction at a temperature of preferably 20 to 120° C., more preferably 50 to 100° C. If the temperature is lower than 20° C., the reaction time will be excessively long. If the temperature is higher than 120° C., a rapidly occurring reaction and a side reaction may cause three-dimensional crosslinking to result in gelatinization. The duration of the reaction of synthesizing the poly(meth)acrylic resin can be selected as appropriate depending on the scale of a batch or conditions to be set for the reaction.

The component (a) of the present invention is preferably a polyimide resin for improved heat resistance of (C) the insulator film. The polyimide resin is a polymer that contains within the molecule a repeating unit containing at least one imide group and that has a weight average molecular weight of 1,000 or greater and 1,000,000 or less in terms of polyethylene glycol.

The polyimide resin of the present invention can be produced through any reaction. The polyimide resin is produced by reacting, for instance, a diamino compound with a tetracarboxylic dianhydride represented by the following General Formula (7):

[Chem. 8]

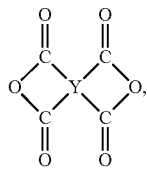

General Formula (7)
where Y is a tetravalent organic group.

The tetracarboxylic dianhydride of the present invention is as described above.

The diamino compound of the present invention is not limited to any particular one. Examples of the diamino compound include a diaminophenol such as m-phenylenediamine, o-phenylenediamine, p-phenylenediamine, m-aminobenzylamine, p-aminobenzylamine, bis(3-aminophenyl)sulfide, (3-aminophenyl) (4-aminophenyl)sulfide, bis(4-aminophenyl)sulfide, bis(3-aminophenyl)sulfoxide, (3-aminophenyl) (4-aminophenyl)sulfoxide, bis(4-aminophenyl)sulfoxide, bis(3-aminophenyl)sulfone, (3-aminophenyl) (4-aminophenyl)sulfone, bis(4-aminophenyl)sulfone, 3,4'-diaminobenzophenone, 4,4'-diaminobenzophenone, 3,3'-diaminobenzophenone, 3,3'-diaminodiphenylmethane, 3,4'-diaminodiphenylmethane, 4,4'-diaminodiphenylmethane, 4,4'-diaminodiphenyl ether, 3,3'-diaminodiphenyl ether, 3,4'-diaminodiphenyl ether, bis[4-(3-aminophenoxyl)phenyl]sulfoxide, bis[4-(aminophenoxy)phenyl]sulfoxide, (4-aminophenoxyphenyl) (3-aminophenoxyphenyl)phenyl]sulfoxide, bis[4-(3-aminophenoxyl)phenyl]sulfone, bis[4-(4-aminophenoxyl)phenyl]sulfone, (4-aminophenoxyphenyl) (3-aminophenoxyphenyl)phenyl]sulfone, bis[4-(3-aminophenoxyl)phenyl]sulfide, bis[4-(aminophenoxy)phenyl]sulfide, (4-aminophenoxyphenyl) (3-aminophenoxyphenyl)phenyl]sulfide, 3,3'-diaminobenzanilide, 3,4'-diaminobenzanilide, 4,4'-diaminobenzanilide, bis[4-(3-aminophenoxyl)phenyl]methane, bis[4-(4-aminophenoxyl)phenyl]methane, [4-(4-aminophenoxyphenyl)][4-(3-aminophenoxyphenyl)]methane, 1,1-bis[4-(3-aminophenoxy)phenyl]ethane, 1,1-bis[4-(4-aminophenoxyl)phenyl]ethane, 1,1-[4-(4-aminophenoxyphenyl)][4-(3-aminophenoxyphenyl]ethane, 1,2-bis[4-(3-aminophenoxyl)phenyl]ethane, 1,2-bis[4-(4-aminophenoxyl)phenyl]ethane, 1,2-[4-(4-aminophenoxyphenyl)][4-(3-aminophenoxyphenyl]ethane, 2,2-bis[4-(3-aminophenoxyl)phenyl]propane, 2,2-bis[4-(4-aminophenoxyl)phenyl]propane, 2,2-[4-(4-aminophenoxyphenyl)][4-(3-aminophenoxyphenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-[4-(4-aminophenoxyphenyl)][4-(3-aminophenoxyphenyl)]-1, 1,1, 3,3,3-hexafluoropropane, 1,3-bis(3-aminophenoxy)benzene, 1,4-bis(3-aminophenoxy)benzene, 1,4-bis(4-aminophenoxy)benzene, 1,3-bis(4-aminophenoxy)benzene, 4,4'-bis(4-aminophenoxy)biphenyl, 4,4'-bis(3-aminophenoxy)biphenyl, bis[4-(3-aminophenoxyl)phenyl]ketone, bis[4-(4-aminophenoxyl)phenyl]ketone, bis[4-(3-aminophenoxyl)phenyl]ether, bis[4-(4-aminophenoxyl)phenyl]ether, polytetramethylene oxide-di-p-aminobenzoate, poly(tetramethylene/3-methyltetramethylene ether)glycol bis(4-aminobenzoate), trimethylene-bis(4-aminobenzoate), p-phenylene-bis(4-aminobenzoate), m-phenylene-bis(4-aminobenzoate), bisphenol A-bis(4-aminobenzoate), 2,4-diaminobenzoic acid, 2,5-diaminobenzoic acid, 3,5-diaminobenzoic acid, 3,3'-diamino-4,4'-dicarboxybiphenyl, 4,4'-diamino-3,3'-dicarboxybiphenyl, 4,4'-diamino-2,2'-dicarboxybiphenyl, [bis(4-amino-2-carboxy)phenyl]methane, [bis(4-amino-3-carboxy)phenyl]methane, [bis(3-amino-4-carboxy)phenyl]methane, [bis(3-amino-5-carboxy)phenyl]methane, 2,2-bis[3-amino-4-carboxyphenyl]propane, 2,2-bis[4-amino-3-carboxyphenyl]propane, 2,2-bis[3-amino-4-carboxyphenyl]hexafluoropropane, 2,2-bis[4-amino-3-carboxyphenyl]hexafluoropropane, 3,3'-diamino-4,4'-dicarboxydiphenyl ether, 4,4'-diamino-3,3'-dicarboxydiphenyl ether, 4,4'-diamino-2,2'-dicarboxydiphenyl ether, 3,3'-diamino-4,4'-dicarboxydiphenyl sulfone, 4,4'-diamino-3,3'-dicarboxydiphenyl sulfone, 4,4'-diamino-2,2'-dicarboxydiphenyl sulfone, 2,3-diaminophenol, 2,4-diaminophenol, 2,5-diaminophenol, and 3,5-diaminophenol; a hydroxy biphenyl compound such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2', 5,5'-tetrahydroxybiphenyl; a dihydroxydiphenylmethane such as 3,3'-diamino-4,4'-dihydroxydiphenylmethane, 4,4'-diamino-3,3'-dihydroxydiphenylmethane, and 4,4'-diamino-2,2'-dihydroxydiphenylmethane; a bis[hydroxyphenyl]propane such as 2,2-bis[3-amino-4-hydroxyphenyl]propane and 2,2-bis[4-amino-3-hydroxyphenyl]propane; a bis[hydroxyphenyl]hexafluoropropane such as 2,2-bis[3-amino-4-hydroxyphenyl]hexafluoropropane and 2,2-bis[3-amino-4-hydroxyphenyl]hexafluoropropane; a hydroxydiphenyl ether such as 3,3'-diamino-4,4'-dihydroxydiphenyl ether, 4,4'-diamino-3,3'-dihydroxydiphenyl ether, and 4,4'-diamino-2,2'-dihydroxydiphenyl ether; a dihydroxydiphenyl sulfone such as 3,3'-diamino-4,4'-dihydroxydiphenyl sulfone, 4,4'-diamino-3,3'-dihydroxydiphenyl sulfone, and 4,4'-diamino-2, 2'-dihydroxydiphenyl sulfone; a dihydroxydiphenyl sulfide such as 3,3'-diamino-4,4'-dihydroxydiphenyl sulfide, 4,4'-diamino-3,3'-dihydroxydiphenyl sulfide, and 4,4'-diamino-2,2'-dihydroxydiphenyl sulfide; a dihydroxydiphenyl sulfoxide such as 3,3'-diamino-4,4'-dihydroxydiphenyl sulfoxide, 4,4'-diamino-3,3'-dihydroxydiphenyl sulfoxide, and 4,4'-diamino-2,2'-dihydroxydiphenyl sulfoxide; a bis[(hydroxyphenyl)phenyl]alkane compound such as 2,2-bis[4-(4-amino-3-hydroxyphenoxy)phenyl]propane; a bis((hydroxyphenoxy)biphenyl compound such as 4,4'-bis(4-amino-3-hydroxyphenoxy)biphenyl; a bis[(hydroxyphenoxy)phenyl]sulfone compound such as 2,2-bis[4-(4-amino-3-hydroxyphenoxy)phenyl]sulfone; and a bis((hydroxyphenoxy)biphenyl compound such as 4,4'-diamino-3, 3'-dihydroxydiphenylmethane, 4,4'-diamino-2,2'-dihydroxydiphenylmethane, 2,2-bis[3-amino-4-carboxyphenyl]propane, and 4,4'-bis(4-amino-3-hydroxyphenoxy)biphenyl. Any of these compounds may be used alone, or two or more of them may be used in combination.

The tetracarboxylic anhydride and the diamino compound can be reacted with each other through any method. The tetracarboxylic anhydride and the diamino compound can be reacted with each other through, for example, any of the methods below.

Method 1: The tetracarboxylic dianhydride is dispersed or dissolved in an organic solvent to prepare a solution, and the diamino compound is added to the prepared solution for a reaction to prepare a polyamic acid solution. The diamino compound is added in such a total amount that the diamino compound is contained at 0.50 to 1.50 mol with respect to 1 mol of the tetracarboxylic dianhydride. After the reaction between the tetracarboxylic dianhydride and the diamino compound ends, the prepared polyamic acid solution is heated at a temperature of 100° C. or higher and 300° C. or lower, preferably 150° C. or higher and 250° C. or lower, to be imidized.

Method 2: A polyamic acid solution is prepared in a manner similar to method 1. Then, to the polyamic acid solution, (i) a catalyst for imidization (preferably a tertiary amine such as pyridine, picoline, isoquinoline, trimethylamine, triethylamine, and tributylamine) and (ii) a dehydrating agent (for example, an acetic anhydride) are added. The resulting polyimide acid solution is heated at a temperature of 60° C. or higher and 180° C. or lower to be imidized.

Method 3: A polyamic acid solution is prepared in a manner similar to method 1. Then, the polyamic acid solution is placed in a vacuum oven heated at a temperature of 100° C. or higher and 250° C. or lower. The vacuum oven is vacuumed during the polyamic acid solution is heated and dried to be imidized.

[(b) Black Coloring Agent having Reflective Range within Infrared Range]

(b) The black coloring agent of the present invention having a reflective range within the infrared range is simply required to be a substance that has, as with a black dye and a black pigment, an effect of giving the black color to another substance and that has a reflectance of 5% or higher in the infrared range, that is, the wavelength range of 800 nm to 2000 nm. The method for measuring the reflectance of (b) the black coloring agent of the present invention having a reflective range within the infrared range is not limited to any particular one. The reflectance of (b) the black coloring agent having a reflective range within the infrared range can be measured through, for example, a method below. The method is of introducing a measurement analyte into a cell and measuring the reflectance with use of photometer U-4100 available from JASCO Corporation.

The black pigment having a reflective range within the infrared range is not limited to any particular one. Examples of the black pigment include a metal complex oxide such as iron-manganese complex oxide, iron-cobalt-chrome complex oxide, iron-chrome-manganese complex oxide, copper-chrome complex oxide, and copper-chrome-manganese complex oxide. Specific examples of the metal complex oxide include the products named AB820 black and AG235 black available from Kawamura Chemical Co., Ltd.; and the products named Black 6350, Black 6301, Black 6302, and Black 6303 available from Asahi Kagaku Kogyo Co., Ltd. Examples of the black pigment having a reflective range within the infrared range further include an organic pigment such as an aniline compound, an anthraquinone compound, and a perylene compound. Specific examples of the black pigment include the products named Paliogen Black 50084, Lumogen Black FK4280, and Lumogen Black FK4281 available from BASF. Any of these black pigments may be used alone, or two or more of them may be used in combination.

The black pigment having a reflective range within the infrared range is more preferably, among other metal complex oxides, a metal complex oxide containing iron, chrome, manganese, or bismuth for better insulation. The black pigment having a reflective range within the infrared range is more preferably, among other organic pigments, a perylene compound for better insulation.

The component (b) of the present invention is contained in (C) the insulator film in an amount of preferably 0.1 to 30 parts by weight, more preferably 1 to 30 parts by weight, with respect to 100 parts by weight of the component (a). This allows (C) an insulator film produced to be excellent in blackness and concealment property. If the content of the component (b) is smaller than 0.1 part by weight with respect to 100 parts by weight of the component (a), (C) the insulator film may be poor in blackness and concealment property. If the content of the component (b) is larger than 30 parts by weight with respect to 100 parts by weight of the component (a), the photosensitive resin composition may have decreased transmittance, with the result of decreased photosensitivity.

[(c) Flame Retarder Substantially Undissolvable in Organic Solvent]

The flame retarder (c) of the present invention, which is substantially undissolvable in the organic solvent, is a compound that is undissolvable in the organic solvent and is a solid therein, that has an effect of preventing organic matter from burning, and that is a solid at room temperature (25° C.). The organic solvent refers to the organic solvent contained in the resin composition of the present invention as one of the other components.

The expression "substantially undissolvable in the organic solvent" as used herein means that the flame retarder (c) is not dissolved at all in the organic solvent or that the flame retarder (c) is dissolved only in such an amount as not to prevent the effects of the present invention from being achieved. To be dissolved only in such an amount as not to prevent the effects of the present invention from being achieved means that the component (c) may be dissolved in the organic solvent at room temperature (25° C.) in an amount of less than 0.1 part by weight with respect to 100 parts by weight of the organic solvent. The flame retarder (c) of the present invention which flame retarder (c) is substantially undissolvable in the organic solvent thus refers to a flame retarder that is dissolved in the organic solvent at room temperature (25° C.) in an amount of less than 0.1 part by weight with respect to 100 parts by weight of the organic solvent. The organic solvent is not limited to any particular one, and can be any of the examples listed above.

The method for measuring parts by weight of that portion of the component (c) which is dissolved in 100 parts by weight of the organic solvent at room temperature (25° C.) is not limited to any particular one. An example method is adding 1 part by weight of the component (c) to 100 parts by weight of the organic solvent, stirring the mixture at 40° C. for 1 hour, cooling the stirred mixture to room temperature (25° C.), letting the cooled mixture to stand for 24 hours or longer, filter the resulting mixture under reduced pressure with use of a PTFE membrane filter having a pore size of 0.45 μm, washing the filter three times with the organic solvent used in this method, drying the washed filter at 60° C. under reduced pressure for 8 hours, and calculating the change in the weight of the filter.

The component (c) of the present invention is preferably at least one selected from the group consisting of a phosphorus compound, a melamine compound, and a metalhydroxide in particular for improved flame retardancy of (C)

the insulator film, reduced generation of outgas, excellent electrical insulation reliability, and reduced warpage in the cured film.

The phosphorus compound of the present invention is not limited to any particular one as long as it is substantially undissolvable in the organic solvent and contains elemental phosphorus. Examples of the phosphorus compound include aluminum tris(diethyl phosphinate), aluminum tris(methylethyl phosphinate), aluminum tris(diphenyl phosphinate), zinc bis(diethyl phosphinate), zinc bis(methylethyl phosphinate), zinc bis(diphenyl phosphinate), titanyl bis(diethyl phosphinate), titanyl bis(methylethyl phosphinate), titanyl bis(diphenyl phosphinate), and melamine polyphosphate. Any of these phosphorus compounds may be used alone, or two or more of them may be used in combination.

The melamine compound of the present invention is not limited to any particular one as long as it is substantially undissolvable in the organic solvent and contains a melamine structure. Examples of the melamine compound include melamine polyphosphate, melamine cyanurate, nitrilotris(methylene)phosphonate melamine adduct, and melamine oligomer condensate. Any of these melamine compounds may be used alone, or two or more of them may be used in combination.

The metalhydroxide of the present invention is not limited to any particular one as long as it is substantially undissolvable in the organic solvent and is a metallic compound containing crystal water. Examples of the metalhydroxide include aluminium hydroxide, magnesium hydroxide, zirconium hydroxide, tin zinc hexahydroxide, zinc borate 3.5 hydrate, and calcium aluminate hydrate. Any of these hydroxides may be used alone, or two or more of them may be used in combination.

The component (c) of the present invention may be contained in (C) the insulator film in an amount of preferably 5 to 100 parts by weight, more preferably 10 to 50 parts by weight, with respect to 100 parts by weight of a combination of the components (a) and (b). This allows an insulator film produced to be excellent in flame retardancy and electrical insulation reliability. If the content of the component (c) is smaller than 5 parts by weight, the insulator film may have poor flame retardancy. If the content of the component (c) is larger than 100 parts by weight, the insulator film may have poor folding endurance, and also the resin composition may deteriorate in coating properties during coating, causing bubbles to be formed in a coating film during coating and/or the appearance of the coating film to be defective as a result of insufficient leveling.

[(d) Thermosetting Resin]

The thermosetting resin (d) of the present invention is a compound containing at least one thermosetting organic group within the molecule.

The component (d) of the present invention is not limited to any particular one as long as it has the above structure. Examples of the component (d) include an epoxy resin, an oxetane resin, a phenol resin, an isocyanate resin, a block isocyanate resin, a bismaleimide resin, a bisallylnadiimide resin, a polyester resin (for example, an unsaturated polyester resin), a diallyl phthalate resin, a silicon resin, a vinyl ester resin, a melamine resin, a polybismaleimide triazine resin (BT resin), a cyanate resin (for example, a cyanate ester resin), a urea resin, a guanamine resin, a sulfonamide resin, an aniline resin, a polyurea resin, a thiourethane resin, a polyazo methine resin, an episulfide resin, an ene-thiol resin, a benzoxazine resin, a copolymer resin of any of the above resins, a modified resin of any of the above resins, and a mixture of the above resins or of any of the above resins with another resin.

The component (d) of the present invention is particularly preferably a polyfunctional epoxy resin among other thermosetting resins because a polyfunctional epoxy resin imparts, to the insulator film, heat resistance as well as adhesiveness to an electric conductor such as a metal foil and a circuit board.

The polyfunctional epoxy resin is a compound containing at least two epoxy groups within the molecule. Examples of the polyfunctional epoxy resin include a bisphenol A epoxy resin, a bisphenol F epoxy resin, a bisphenol S epoxy resin, a hydrogenated bisphenol A epoxy resin, a biphenyl epoxy resin, a phenoxy epoxy resin, a naphthalene epoxy resin, a phenol novolac epoxy resin, a cresol novolac epoxy resin, a trisphenol methane epoxy resin, a dicyclopentadiene epoxy resin, an amine epoxy resin, a flexible epoxy resin, a urethane-modified epoxy resin, a rubber-modified epoxy resin, a chelate-modified epoxy resin, and a heterocycle-containing epoxy resin.

Specific examples of the bisphenol A epoxy resin include the products named jER828, jER1001, and jER1002 available from Japan Epoxy Resins Co., Ltd., the products named ADEKA RESIN EP-4100E and ADEKA RESIN EP-4300E available from Adeka Corporation, the products named RE-310S and RE-410S available from Nippon Kayaku Co., Ltd., the products named EPICLON 840S, EPICLON 850S, EPICLON 1050, and EPICLON 7050 available from DIC Corporation, and the products named Epotote YD-115, Epotote YD-127, and Epotote YD-128 available from Tohto Kasei Co., Ltd. Specific examples of the bisphenol F epoxy resin include the products named jER806 and jER807 available from Japan Epoxy Resins Co., Ltd., the products named ADEKA RESIN EP-4901E, ADEKA RESIN EP-4930, and ADEKA RESIN EP-4950 available from Adeka Corporation, the products named RE-3035, RE-3045, RE-4035, and RE-4045 available from Nippon Kayaku Co., Ltd., the products named EPICLON 830 and EPICLON 835 available from DIC Corporation, and the products named Epotote YDF-170, Epotote YDF-1755, and Epotote YDF-2001 available from Tohto Kasei Co., Ltd. Specific examples of the bisphenol S epoxy resin include the product named EPICLON EXA-1514 available from DIC Corporation. Specific examples of the hydrogenated bisphenol A epoxy resin include the products named jERYX8000, jERYX8034, and jERYL7170 available from Japan Epoxy Resins Co., Ltd., the product named ADEKA RESIN EP-4080E available from Adeka Corporation, the product named EPICLON EXA-7015 available from DIC Corporation, and the products named Epotote YD-3000 and Epotote YD-4000D available from Tohto Kasei Co., Ltd. Specific examples of the biphenyl epoxy resin include the products named jERYX4000, jERYL6121H, jERYL6640, and jERYL6677 available from Japan Epoxy Resins Co., Ltd., and the products named NC-3000 and NC-3000H available from Nippon Kayaku Co., Ltd. Specific examples of the phenoxy epoxy resin include the products named jER1256, jER4250, and jER4275 available from Japan Epoxy Resins Co., Ltd. Specific examples of the naphthalene epoxy resin include the products named EPICLON HP-4032, EPICLON HP-4700, and EPICLON HP-4200 available from DIC Corporation, and the product named NC-7000L available from Nippon Kayaku Co., Ltd. Specific examples of the phenol novolac epoxy resin include the products named jER152 and jER154 available from Japan Epoxy Resins Co., Ltd., the product named EPPN-201-L available from Nippon Kayaku Co., Ltd., the products named EPICLON N-740 and EPICLON N-770 available from DIC Corporation, and the product named Epotote YDPN-638 available from Tohto Kasei Co., Ltd. Specific examples of the cresol novolac epoxy resin include the products named EOCN-1020, EOCN-1025, EOCN-1035, and EOCN-1045 available from Nippon Kayaku Co., Ltd., and the products named EPICLON N-660, EPICLON N-670, EPICLON N-680, and EPICLON N-695 available from DIC Corporation. Specific examples of the trisphenol methane epoxy resin include the products named EPPN-501H, EPPN-501HY, and EPPN-502H available from Nippon Kayaku Co., Ltd. Specific examples of the dicyclopentadiene epoxy resin include the product named XD-1000 available from Nippon Kayaku Co., Ltd. and the product named EPICLON HP-7200 available from DIC Corporation. Specific examples of the amine epoxy resin include the products named jER604 and jER630 available from Japan Epoxy Resins Co., Ltd., the products named Epotote YH-434 and Epotote YH-434L available from Tohto Kasei Co., Ltd., and the products named TETRAD-X and TERRAD-C available from Mitsubishi Gas Chemical Company, Inc. Specific examples of the flexible epoxy resin include the products named jER871, jER872, jERYL7175, and jERYL7217 available from Japan Epoxy Resins Co., Ltd., and the product named EPICLON EXA-4850 available from DIC Corporation. Specific examples of the urethane-modified epoxy resin include the products named ADEKA RESIN EPU-6, ADEKA RESIN EPU-73, and ADEKA RESIN EPU-78-11 available from Adeka Corporation. Specific examples of the rubber-modified epoxy resin include the products named ADEKA RESIN EPR-4023, ADEKA RESIN EPR-4026, and ADEKA RESIN EPR-1309 available from Adeka Corporation. Specific examples of the chelate-modified epoxy resin include the products named ADEKA RESIN EP-49-10 and ADEKA RESIN EP-49-20 available from Adeka Corporation. Specific examples of the heterocycle-containing epoxy resin include the product named TEPIC (triglycidyl isocyanurate) available from Nissan Chemical Industries, Ltd.

The resin composition of the present invention may contain a curing agent or curing accelerator to accelerate curing of the thermosetting resin. The curing agent for use in the resin composition of the present invention is not limited to any particular one. Examples of the curing agent include a phenol resin such as phenol novolac resin, cresol novolac resin, and naphthalene type phenolic resin, an amino resin, a urea resin, melamine, and dicyandiamide. Any of these curing agents may be used alone, or two or more of them may be used in combination.

The curing accelerator for use in the resin composition of the present invention is not limited to any particular one. Examples of the curing accelerator include a phosphine-based compound such as triphenylphosphine; an amine compound such as a tertiary amine, trimethanolamine, triethanolamine, and tetraethanolamine; a borate-based compound such as 1,8-diaza-bicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecyl imidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecyl imidazoline, 2,4-dimethyl imidazoline, and 2-phenyl-4-methyl imidazoline; and azine-based imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. Any of these curing accelerators may be used alone, or two or more of them may be used in combination.

[(e) Photopolymerization Initiator]

The photopolymerization initiator (e) of the present invention is a compound that is activated with such energy as of UV and that initiates and accelerates a reaction of a resin containing a radically polymerizable group. Thus, in the case where the resin composition of the present invention contains (i) a radically polymerizable resin containing a radically polymerizable group and (ii) the photopolymerization initiator (e), the resin composition is a photosensitive resin composition. Examples of the radically polymerizable group include an acryloyl group, a methacryloyl group, and a vinyl group. The radically polymerizable resin of the present invention may be contained in (a) the binder polymer, or alternatively a radically polymerizable compound may be contained in the resin composition of the present invention as one of the other components. The stiffener-integrated flexible printed circuit board of the present invention preferably includes (C) an insulator film made of a photosensitive resin composition containing the photopolymerization initiator (e). The component (e) of the present invention is not limited to any particular one. Examples of the component (e) include Michler's ketone, 4,4'-bis(diethylamino)benzophenone, 4,4',4"-tris(dimethylamino)triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butylanthraquinone, 1,2-benzo-9,10-anthraquinone, methylanthraquinone, thioxanthone, 2,4-diethylthioxanthone, 2-isopropylthioxanthone, 1-hydroxycyclohexyl phenyl ketone, diacetylbenzyl, benzyl dimethyl ketal, benzyl diethyl ketal, 2-(2'-furilethylidene)-4,6-bis(trichloromethyl)-S-triazine, 2-[2'-(5"-methylfuril)ethylidene]-4,6-bis(trichloromethyl)-S-tri azine, 2-(p-methoxyphenyl)-4,6-bis(trichloromethyl)-S-triazine, 2,6-di(p-azidobenzal)-4-methylcyclohexanone, 4,4'-diazidochalcon, di(tetraalkylammonium)-4,4'-diazidostilbene-2,2'-disulfonate, 2,2-dimethoxy-1,2-diphenylethane-1-one, 1-hydroxy-cyclohexyl-phenyl-ketone, 2-hydroxy-2-methyl-1-phenyl-propane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, 2-benzyl-2-dimethylamino-1-(4-morpholinophenyl)-butane-1, bis(2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n-5,2,4-cyclopentadiene-1-yl)-bis(2,6-difluoro-3-(1H-pyrrole-1-yl)-phenyl)titanium, 1,2-octanedione, 1-[4-(phenylthio)-2-(O-benzoyloxime)], iodonium, (4-methylphenyl)[4-(2-methylpropyl)phenyl]-hexafluorophosphate(1-), ethyl-4-dimethylaminobenzoate, 2-ethylhexyl-4-dimethylaminobenzoate, ethanone, and 1-[9-ethyl-6-(2-methylbenzoyl)-9H-carbazole-3-yl]-1-(O-acetyloxime). The photopolymerization initiator (e) is desirably a photopolymerization initiator selected as appropriate, and is desirably a mixture of two or more of the above examples.

The photopolymerization initiator (e) of the present invention is preferably contained in an amount of 0.1 to 50 parts by weight with respect to 100 parts by weight of a combination of the components (a) and (b). The photopolymerization initiator (e) is preferably contained at a proportion within the above range for improved photosensitivity of the photosensitive resin composition of the present invention. If the photopolymerization initiator (e) is contained at a proportion smaller than the above range, the radically polymerizable group will not react easily when the photosensitive resin composition is irradiated with light, likely resulting in the photosensitive resin being cured insufficiently. If the component (e) is contained at a proportion larger than the above range, it will be difficult to adjust the amount of light with which the photosensitive resin composition is irradiated, possibly resulting in the photosensitive resin composition being overexposed to light. The content of the photopolymerization initiator (e) is, as described above, preferably adjusted to a proportion within the above range for an efficient photo-curing reaction.

[Other Components]

The resin composition of the present invention can further contain, where necessary, any of various additives such as an organic solvent, a radically polymerizable compound, a filler, an adhesion promoting agent, a defoaming agent, a leveling agent, a polymerization inhibitor, and a flame retarder other than the flame retarder (c) substantially undissolvable in the organic solvent.

The organic solvent is not limited to any particular one as long as it is an organic polar solvent. Examples of the organic solvent include a sulfoxide solvent such as dimethyl sulfoxide and diethyl sulfoxide, a formamide solvent such as N,N-dimethyl formamide and N,N-diethyl formamide, an acetamide solvent such as N,N-dimethyl acetamide and N,N-diethyl acetamide, a pyrrolidone solvent such as N-methyl-2-pyrrolidone and N-vinyl-2-pyrrolidone, hexamethylphosphoramide, and γ-butyrolactone. Further, the organic polar solvent can be used in combination with an aromatic hydrocarbon such as xylene and toluene where necessary.

Examples of the organic solvent of the present invention further include solvents of (i) a symmetric glycol diether such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether), (ii) an acetate such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (also known as carbitol acerate or 2-(2-butoxyethoxyl)ethyl acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate, and (iii) an ether such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, and ethylene glycol monoethyl ether.

The radically polymerizable compound is a compound containing within the molecule a radically polymerizable group whose polymerization reaction progresses with use of a radical polymerization initiator. The radically polymerizable compound is more preferably, among other compounds, a resin containing at least one unsaturated double bond as the radically polymerizable group within the molecule. The unsaturated double bond is preferably a (meth)acryloyl group or a vinyl group.

The radically polymerizable compound is preferably contained in the case where the component (a) does not contain a (meth)acryloyl group. The radically polymerizable compound may be contained even in the case where the component (a) contains a (meth)acryloyl group.

Examples of the radically polymerizable compound include bisphenol F EO-modified (n=2 to 50) diacrylate, bisphenol A EO-modified (n=2 to 50) diacrylate, bisphenol S EO-modified (n=2 to 50) diacrylate, bisphenol F EO-modified (n=2 to 50) dimethacrylate, bisphenol A EO-modified (n=2 to 50) dimethacrylate, bisphenol S EO-modified (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacyrlate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxy diethylene glycol methacrylate, methoxy polyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxy diethoxy)phenyl]propane, 2,2-bis[4-(methacryloxy polyethoxy)phenyl]propane, polyethylene glycol diacrylate, tripropylene glycol diacrylate, polypropylene glycol diacrylate, 2,2-bis[4-(acryloxy diethoxy)phenyl]propane, 2,2-bis[4-(acryloxy polyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylenealkyl ether acrylate, nonylphenoxyethylene glycol acrylate, polypropylene glycol dimethacrylate, 1,4-butandiol dimethacrylate, 3-methyl-1,5-pentanediol dimethacrylate, 1,6-hexanediol dimethacrylate, 1,9-nonanediol dimethacrylate, 2,4-diethyl-1,5-pentanediol dimethacrylate, 1,4-cyclohexane dimethanol dimethacrylate, dipropylene glycol diacrylate, tricyclodecane dimethanol diacrylate, 2,2-hydrogenated bis[4-(acryloxy polyethoxy)phenyl]propane, 2,2-bis[4-(acryloxy polypropoxy)phenyl]propane, 2,4-diethyl-1,5-pentanediol diacrylate, ethoxylated trimethylolpropane triacrylate, propoxylated trimethylolpropane triacrylate, isocyanuric acid tri(ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3,5-benzenecarboxylate, triallylamine, triallyl citrate, triallyl phosphate, allobarbital, diallylamine, diallyl dimethyl silane, diallyl disulfide, diallyl ether, diallyl cyanurate, diallyl isophthalate, diallyl terephthalate, 1,3-diallyloxy-2-propanol, diallyl sulfide diallyl maleate, 4,4'-isopropylidene diphenol dimethacrylate, and 4,4'-isopropylidene diphenol diacrylate. Any of these radically polymerizable compounds may be used alone, or two or more of them may be used in combination. The radically polymerizable compound is preferably, among others, a diacrylate or dimethacrylate containing within the molecule 2 to 50 mol of an EO (ethylene oxide) repeating unit for (i) improved solubility of the photosensitive resin composition in an aqueous developer such as an alkaline aqueous solution and (ii) reduced developing time.

Examples of the filler include a fine inorganic filler such as silica, mica, talc, barium sulfate, wollastonite, and calcium carbonate.

Examples of the defoaming agent include an acrylic compound, a vinyl compound, and a butadiene compound.

Examples of the leveling agent include an acrylic compound and a vinyl compound.

Examples of the adhesion promoting agent (also referred to as "adhesion promoter") include a silane coupling agent, a triazole compound, a tetrazole compound, and a triazine compound.

Examples of the polymerization inhibitor include hydroquinone and hydroquinone monomethyl ether.

Examples of the flame retarder other than the flame retarder (c) substantially undissolvable in the organic solvent include a phosphoric ester compound, a halogen-based compound, a metalhydroxide, an organophosphate compound, and a silicone. The flame retarder other than the flame retarder (c) substantially undissolvable in the organic solvent is used as an addition type flame retarder or reaction type flame retarder. Any of these flame retarders may be used alone, or two or more of them may be used in appropriate combination.

The other flame retarder is more preferably, among others, a non-halogen compound, particularly preferably a phosphorus flame retarder, for reduction of environmental pollution.

[Method for Mixing Resin Composition and Method for Preparing Insulator Film]

The resin composition, of which (C) the insulator film of the present invention is made, is prepared by uniformly mixing the components (a) and (b) as well as the components (c), (d), and (e) and other components where necessary. The resin composition prepared is formed on the upper surface of (D) the wiring-pattern-equipped film, and is then subjected where necessary to exposure and development to form minute openings. The resin composition is further heat-treated, finally producing a flexible printed circuit board of the present invention. The method for uniformly mixing the components of (C) the insulator film is not limited to any particular one. An example method is mixing the components with use of a known kneading apparatus such as a triple-roll mill and a beads-mill device. In the case where the respective solutions of the components are low in viscosity, a known stirrer may be used instead for the mixing. It is preferable to use, among the above mixing apparatuses, a triple-roll mill to pulverize and disperse the components to mix them for a uniform size of the component (c). The particle diameter of each component in the mixed resin composition can be measured with use of a gauge conforming to JIS K 5600-2-5. A particle size distribution measurement apparatus can be used to measure the average particle diameter, particle diameter, and particle size distribution of each component in the mixed resin composition.

Then, the insulator film can be produced from the resin composition through any method. Examples of the method for producing the insulator film include (1) a method of (i) applying the resin composition to (D) the wiring-pattern-equipped film without processing the resin composition and (ii) curing the applied resin composition to form an insulator film and (2) a method of (i) forming a film of the resin composition on a supporter, (ii) attaching the uncured film onto (D) the wiring-pattern-equipped film, and (iii) curing the film to form an insulator film. The method (1) of (i) applying the resin composition to (D) the wiring-pattern-equipped film without processing the resin composition and (ii) curing the applied resin composition to form an insulator film, specifically, first applies the resin composition to (D) the wiring-pattern-equipped film and dries the resin composition to remove the solvent. The resin composition can be applied to (D) the wiring-pattern-equipped film by, for example, screen printing, roller coating, curtain coating, spray coating, or rotational application by use of a spinner. The film as applied (preferably having a thickness of 5 to 100 μm) is dried at a temperature of 120° C. or lower, preferably 40 to 100° C.

After drying the film, the method then, where necessary, places a negative photolithographic mask on the dried film and irradiates the dried film with active light rays such as ultraviolet rays, visible light rays, and electron rays for exposure. Next, an unexposed area is developed with use of a developer through any of various methods such as a shower method, a paddle method, a dipping method, and an ultrasonic wave method to form minute openings. The amount of time required for the pattern to be exposed varies depending on (i) the atomizing pressure and flow rate of the development apparatus and (ii) the temperature of the etchant. Thus, the optimum apparatus conditions should desirably be found as appropriate.

The developer is preferably an alkaline aqueous solution. The developer may contain a water-soluble organic solvent such as methanol, ethanol, n-propanol, isopropanol, and N-methyl-2-pyrrolidone. Examples of an alkaline compound from which the alkaline aqueous solution is prepared include a hydroxide, a carbonate, a hydrogencarbonate, and an amine compound of an alkali metal, an alkali earth metal, or ammonium ion. More specifically, examples of the alkaline compound include sodium hydroxide, potassium hydroxide, ammonium hydroxide, sodium carbonate, potassium carbonate, ammonium carbonate, sodium hydrogencarbonate, potassium hydrogen carbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. The alkaline compound can, of course, be a compound other than the above examples as long as it allows an aqueous solution to be basic. The temperature of the developer depends on the composition of the resin composition or on that of the alkaline developer. The temperature of the developer is generally 0° C. or higher and 80° C. or lower, more generally 10° C. or higher and 60° C. or lower.

The minute openings formed in the developing step are rinsed for removal of a useless remaining portion. Examples of a rinse agent include water and an acidic aqueous solution.

The film is then heat-treated. This heat treatment allows (C) an insulator film produced to be excellent in heat resistance and chemical resistance. The thickness of (C) the insulator film is determined in view of the thickness of (D)

the wiring-pattern-equipped film, while it is preferably approximately 5 to 100 µm. The final temperature during the heat treatment is preferably 100° C. or higher and 250° C. or lower, further preferably 120° C. or higher and 200° C. or lower, particularly preferably 130° C. or higher and 180° C. or lower, for prevention of (i) oxidation of a conductor circuit and the like and (ii) decrease in adhesiveness to (D) the wiring-pattern-equipped film. A heat treatment temperature of higher than 250° C. will accelerate oxidative degradation of a conductor circuit and the like and decrease adhesiveness to (D) the wiring-pattern-equipped film.

The method (2) of (i) forming a film of the resin composition on a supporter, (ii) attaching the uncured film onto (D) the wiring-pattern-equipped film, and (iii) curing the film to form an insulator film is a method of first uniformly applying the resin composition onto a supporter, and then heating and/or blowing hot air to the resin composition applied. This removes part of the solvent, forming an uncured film of the resin composition.

The heating and/or hot air blowing for the solvent removal is performed simply at such a temperature that the heating will not cause a cross-linking reaction in the thermosetting resin or the like of the component (d) contained in the resin composition. The supporter used in this method is not limited to any particular one. Examples of the supporter include various commercially available films such as a polyethylene terephthalate (PET) film, a polyphenylene sulfide film, and a polyimide film. The supporter is, among others, often a PET film because a PET film has certain heat resistance and is available relatively inexpensively. The supporter may have a surface at which the supporter is joined to the resin composition, the surface having been surface-treated for improved adhesiveness and removability. Further, a protective film may further be formed on the resin composition. Forming a protective film on the resin composition prevents dirt and dust in the air from adhering to the resin composition and prevents the resin composition from deteriorating in quality due to dryness. The protective film is preferably formed on a surface of the resin composition by lamination at a temperature of 10° C. to 50° C. A laminating temperature of higher than 50° C. may cause thermal expansion in the protective film, with the result of wrinkles and curls in the protective film after the lamination. The protective film is detached from the resin composition before the resin composition and the support provided with the protective film are used for assembly of the printed circuit board of the present invention. The protective film thus desirably has a surface at which the protective film is joined to the resin composition, the surface having (i) appropriate adhesiveness at the time of its storage and (ii) excellent removability.

The material of the protective film is not limited to any particular one. Examples of the material include a polyethylene film (PE film), a polyethylene vinyl alcohol film (EVA film), a copolymer film of polyethylene and ethylene vinyl alcohol (hereinafter referred to as "(PE+EVA) copolymer film"), a laminate of a PE film and a (PE+EVA) copolymer film, and a film produced through co-extrusion of a (PE+EVA) copolymer and polyethylene (that is, a film having a PE film on one surface and a (PE+EVA) copolymer film on the other surface).

Next, the protective film is detached from the film made up of the protective film, the resin composition, and the supporter. Then, the wiring-pattern-equipped film is covered with a film of the resin composition so that the resin composition and the wiring-pattern-equipped film face each other. The resin composition and the wiring-pattern-equipped film are thereafter joined on top of each other by thermocompression bonding. This joining by thermocompression bonding is simply required to be performed through such a process as thermal pressing, laminating (thermal laminating), or hot roll laminating. The process is not limited to any particular one. In the case where the joining is performed through thermal laminating or hot roll laminating (hereinafter referred to as "lamination"), the processing temperature is simply required to be not lower than the lower-limit temperature at or above which the lamination can be performed (hereinafter referred to as "bondable temperature"). Specifically, the bondable temperature falls within the range of preferably 50° C. to 150° C., more preferably 60° C. to 120° C., particularly preferably 80° C. to 120° C. If the bondable temperature exceeds 150° C., the lamination may heat the resin composition to cause a cross-linking reaction, with the result that cure of the resin composition may proceed. If the bondable temperature is lower than 50° C., the resin composition will be low in flowability, which will then make it difficult to embed a pattern circuit in the resin composition.

The film of the resin composition is kept uncured. The film thus has a moderate level of flowability when the film is subjected to a thermocompression bonding process such as thermal laminating, and allows the conductor circuit of the wiring-pattern-equipped film to be suitably embedded in the resin composition.

The above thermocompression bonding process produces a laminate sample including (i) the wiring-pattern-equipped film, (ii) a film of the resin composition on the wiring-pattern-equipped film, and (iii) the supporter on the resin composition film.

Then, where necessary, a negative photolithographic mask is placed on the supporter of the laminate sample, and the laminate sample is irradiated with active light rays such as ultraviolet rays, visible light rays, and electron rays for exposure. Next, the supported is detached, and an unexposed area is developed with use of a developer through any of various methods such as a shower method, a paddle method, a dipping method, and an ultrasonic wave method to form minute openings. The amount of time required for the pattern to be exposed varies depending on (i) the atomizing pressure and flow rate of the development apparatus and (ii) the temperature of the etchant. Thus, the optimum apparatus conditions should desirably be found as appropriate.

The developer is preferably an alkaline aqueous solution. The developer may contain a water-soluble organic solvent such as methanol, ethanol, n-propanol, isopropanol, and N-methyl-2-pyrrolidone. Examples of an alkaline compound from which the alkaline aqueous solution is prepared include a hydroxide, a carbonate, a hydrogencarbonate, and an amine compound of an alkali metal, an alkali earth metal, or ammonium ion. More specifically, examples of the alkaline compound include sodium hydroxide, potassium hydroxide, ammonium hydroxide, sodium carbonate, potassium carbonate, ammonium carbonate, sodium hydrogencarbonate, potassium hydrogen carbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. The alkaline compound can, of course, be a compound other than the above examples as long as it allows an aqueous solution to be basic. The temperature of the developer depends on the composition of the resin composition or on that of the alkaline developer. The temperature of the developer is generally 0° C. or higher and 80° C. or lower, more generally 10° C. or higher and 60° C. or lower.

The minute openings formed in the developing step are rinsed for removal of a useless remaining portion. Examples of a rinse agent include water and an acidic aqueous solution.

The film is then heat-treated. This heat treatment allows (C) an insulator film produced to be excellent in heat resistance and chemical resistance. The thickness of (C) the insulator film is determined in view of, for example, the thickness of (D) the wiring-pattern-equipped film, and is preferably approximately 5 to 100 μm. The final temperature during the heat treatment is preferably 100° C. or higher and 250° C. or lower, further preferably 120° C. or higher and 200° C. or lower, particularly preferably 130° C. or higher and 180° C. or lower, for prevention of (i) oxidation of a conductor circuit and the like and (ii) decrease in adhesiveness to (D) the wiring-pattern-equipped film. A heat treatment temperature of higher than 250° C. will accelerate oxidative degradation of a conductor circuit and the like and decrease adhesiveness to (D) the wiring-pattern-equipped film.

<(D) Wiring Patterned Film>

The wiring-pattern-equipped film of the present invention is a film including a base film having a thickness 5 to 100 μm and a wiring pattern(s) on one or both surfaces of the base film. The method for preparing the wiring-pattern-equipped film of the present invention is not limited to any particular one. An example method is forming an electrically conductive layer on a base film to prepare a flexible metal-clad laminate and pattern-etching the electrically conductive layer.

The base film of the present invention is not limited to any particular one as long as it is a flexible and insulating film. Examples of the base film include films of polypropylene, crosslinked polyethylene, polyester, polybenzimidazole, polyimide, polyimideamide, polyetherimide, polyphenylene sulfide, liquid crystal polymer, and polyether ether ketone. In the case where the base film does not require heat resistance, the base film is preferably a polyester film, which is inexpensive. In the case where the base film does require heat resistance, the base film is preferably a polyimide film.

The electrically conductive layer of the present invention is not limited to any particular one. Examples of the electrically conductive layer include layers of copper or a copper alloy, stainless steel or an alloy thereof, nickel or a nickel alloy (including 42 alloy), and aluminum or an aluminum alloy. As with a typical flexible metal-clad laminate, the electrically conductive layer of the present invention is preferably made of copper foil such as rolled copper foil and electrolytic copper foil. The metal foil may have a surface coated with an antirust layer, a heat-resistant layer, or an adhesive layer.

The method for forming an electrically conductive layer on the base film of the present invention, that is, the method for preparing a flexible metal-clad laminate, is not limited to any particular one. Examples of the method include a casting method, a laminating method, and a metalizing method. The casting method is a method of applying a base film solution on an electrically conductive layer, drying the applied solution, and thermally curing the base film. The laminating method is a method of forming a base film and an electrically conductive layer by thermocompression bonding. The laminating method is categorized into two types: a method of preparing a so-called three-layer metal-clad laminate, that is, a metal-clad laminate made up of a base film, an electrically conductive layer, and an adhesive therebetween; and a method of preparing a so-called two-layer metal-clad laminate, that is, a metal-clad laminate made up of a base film and an electrically conductive layer with no adhesive therebetween. Examples of the adhesive include an epoxy resin and an acrylic resin. The metalizing method is a method of forming a thin metal film on a base film by vacuum vapor deposition or sputtering and forming an electrically conductive layer on the thin metal film by wet plating. The metalizing method may omit forming a thin metal film and form an electrically conductive layer on a base film by wet plating. Any of the above methods allows an electrically conductive layer to be formed on one or both surfaces of the base film.

The method for pattern-etching the electrically conductive layer of the present invention is not limited to any particular one. Examples of the method include a photoresist technique. The photoresist technique is a method of forming a photoresist layer on the metal-clad laminate, exposing the photoresist layer, developing the photoresist layer, etching the electrically conductive layer, and detaching the dry film to form a wiring pattern. The photoresist layer can be a negative or positive photoresist layer in the form of a liquid, a film or the like. The method for forming the photoresist layer is not limited to any particular one. Examples of the method include (i) a method of forming a negative dry film resist on the metal-clad laminate by thermal lamination and (ii) a method of applying a positive liquid resist onto the metal-clad laminate and drying the applied resist to form a positive liquid resist on the metal-clad laminate. Portions other than the exposed portions are removed by development in the method with the use of a negative photoresist, while the exposed portions are removed by development in the method with the use of a positive photoresist. A dry film resist is easy to produce to have a large film thickness. Examples of the negative dry film photoresist include the product named SPG-152 available from Asahi Kasei Co., Ltd. and the product named RY-3215 available from Hitachi Chemical Co., Ltd. The method for removing a photoresist layer by development can use a publicly known agent selected as appropriate for removing a photoresist layer by development. As an example method, a sodium carbonate aqueous solution (for example, 0.2 to 1.5%) is sprayed onto a photoresist layer to remove the photoresist layer by development. The method for etching the electrically conductive layer can be a publicly known method selected as appropriate for etching the electrically conductive layer. In the method, for example, a potassium ferricyanide aqueous solution, a ferric chloride aqueous solution, a copper chloride aqueous solution, an ammonium persulfate aqueous solution, a sodium persulfate aqueous solution, a hydrogen peroxide water, a hydrofluoric acid aqueous solution, or a combination of any of these can be used.

The stiffener-integrated flexible printed circuit board (FPC) of the present invention has excellent adhesiveness between the thermosetting adhesive for the stiffener and the insulator film, and has only small warpage. The FPC of the present invention is thus particularly suitable as a FPC for a liquid crystal display, a sensor, or a camera module for a compact portable terminal. Further, the FPC of the present invention can be used as a FPC for hinge bending, slide bending, a cable, a connector, a hard disk optical pickup or the like.

EXAMPLES

The present invention is described below in detail on the basis of Examples. The present invention is, however, not limited in scope to the Examples.

Synthesis Example 1

<(a) Binder Polymer 1>

Into a reaction container equipped with a stirrer, a thermometer, a dropping funnel, a condenser, and a nitrogen inlet tube, 100.0 g of methyl triglyme (=1,2-bis(2-methoxyethoxy)ethane) was fed as a solvent for polymerization. The solvent was heated to 80° C. while being stirred under a nitrogen stream. Then, a mixture of 12.0 g (0.14 mol) of methacrylic acid, 28.0 g (0.16 mol) of benzyl methacrylate, 60.0 g (0.42 mol) of butyl methacrylate, 0.5 g of azobisisobutyronitrile as a radical polymerization initiator, which had been prepared in advance at room temperature (25° C.), was dropped through the dropping funnel into the heated solvent over a period of 3 hours while being kept at 80° C. After the drop ended, the reaction solution was heated to 90° C. while being stirred. Then, the reaction solution was, while being kept at 90° C., further stirred for 2 hours for a reaction, which produced a poly(meth)acrylic resin solution (a-1). The resin solution produced had a solid content concentration of 50%, a weight average molecular weight of 48,000, and an acid value of 78 mgKOH/g for the solid content. The solid content concentration, the weight average molecular weight, and the acid value were measured through the following methods:

<Solid Content Concentration>

The solid content concentration was measured in conformity to JIS K 5601-1-2. The resin solution was dried at 170° C. for 1 hour.

<Weight Average Molecular Weight>

The weight average molecular weight was measured under the following conditions:

Apparatus used: Tosoh Corporation HLC-8220GPC Equivalent

Column: TSK gel Super AWM-H (available from Tosoh Corporation, 6.0 mm I.D.×15 cm)×2

Guard column: TSK guard column Super AW-H available from Tosoh Corporation

Eluant: 30 mM LiBr+20 mM H3PO4 in DMF

Flow rate: 0.6 mL/min

Column temperature: 40° C.

Detection condition: RI: polarity (+), response (0.5 sec)

Sample concentration: Approximately 5 mg/mL

Standard preparation: PEG (polyethylene glycol)

<Acid Value>

The acid value was measured in conformity to JIS K 5601-2-1.

Synthesis Example 2

<(a) Binder Polymer 2>

Into a reaction container equipped with a stirrer, a thermometer, a dropping funnel, a condenser, and a nitrogen inlet tube, 30.00 g of methyl triglyme (=1,2-bis(2-methoxyethoxy)ethane) was fed as a solvent for polymerization. Then, 10.31 g (0.050 mol) of norbornene diisocyanate was added to the solvent, and was dissolved therein by heating the solvent to 80° C. while stirring the solvent under a nitrogen stream. Into the resulting solution, a solution in which 50.00 g (0.025 mol) of polycarbonate diol (available from Asahi Kasei Co., Ltd., product name: PCDL T5652, weight average molecular weight of 2000) and 6.51 g (0.050 mol) of 2-hydroxyethyl methacrylate had been dissolved in 30.00 g of methyl triglyme was dropped through the dropping funnel over a period of 1 hour. After the drop ended, the resulting solution was heated at 80° C. and stirred for 5 hours for a reaction, which produced a urethane resin solution (a-2) containing a urethane bond within the molecule. The resin solution produced had a solid content concentration of 53% and a weight average molecular weight of 5,200. The solid content concentration and the weight average molecular weight were measured through a method similar to that of Synthesis Example 1.

Synthesis Example 3

<(a) Binder Polymer 3>

Into a reaction container equipped with a stirrer, a thermometer, a dropping funnel, a condenser, and a nitrogen inlet tube, 130.60 g of methyl triglyme (=1,2-bis(2-methoxyethoxy)ethane) was added as a solvent for polymerization. To the solvent, 31.02 g (0.100 mol) of 3,3',4,4'-oxydiphthalic dianhydride, 34.45 g (0.080 mol) of bis[4-(3-aminophenoxyl)phenyl]sulfone, and 24.76 g (0.020 mol) of poly(tetramethylene/3-methyltetramethylene ether)glycol bis(4-aminobenzoate) were added, and the resulting solvent was stirred for 30 minutes under a nitrogen stream. As a result a polyamic acid solution was prepared. Then, the polyamic acid solution was heated to 190° C. for a reaction over a period of 2 hours, which produced a polyimide resin solution (a-3). The resin solution produced had a solid content concentration of 49% and a weight average molecular weight of 36,000. The solid content concentration and the weight average molecular weight were measured through a method similar to that of Synthesis Example 1.

Examples 1-9 and Comparative Examples 1-3

<Preparation of Resin Composition>

To each of (a) the binder polymers produced in the synthesis examples, (b) a black coloring agent having a reflective range within the infrared range, a flame retarder (c) substantially undissolvable in the organic solvent, a thermosetting resin (d), a photopolymerization initiator (e), and other components were added to prepare a resin composition. Tables 1 and 2 show the amount of each constituent ingredient in the resin solid content and the type of each ingredient. In the tables, the amount of 1,2-bis(2-methoxyethoxy)ethane as an organic solvent indicates a total amount including the amount of the solvent contained in the resin solution synthesized. Each resin composition was first mixed in a stirrer equipped with a typical stirring blade and then passed through a triple-roll mill twice to prepare a homogeneous solution. The particle diameter was measured with use of a grindometer, with the result that the particle diameter of each resin composition was 10 μm or smaller. The mixed solution was completely defoamed with use of a defoaming device, and was evaluated as below.

TABLE 1

Unit: parts by weight

| Components | Constituent ingredients of resin composition | Ex 1 | Ex 2 | Ex 3 | Ex 4 | Ex 5 | Ex 6 | Ex 7 | Ex 8 | Com Ex 1 | Com Ex 2 |
|---|---|---|---|---|---|---|---|---|---|---|---|
| Component (a) | Binder polymer 1 | 42.0 | 42.0 | — | — | 42.0 | 42.0 | 42.0 | 42.0 | 42.0 | 42.0 |
| | Binder polymer 2 | — | — | 42.0 | — | — | — | — | — | — | — |
| | Binder polymer 3 | — | — | — | 42.0 | — | — | — | — | — | — |
| Component (b) | Black 6350 <1> | — | 20.0 | 20.0 | 20.0 | — | — | — | — | — | — |
| | Black 6303 <2> | — | — | — | — | 20.0 | — | — | — | — | — |
| | Paliogen Black S0084 <3> | 5.0 | — | — | — | — | 5.0 | 5.0 | 5.0 | — | — |
| BP | Carbon black M-50 <4> | — | — | — | — | — | — | — | — | 5.0 | 5.0 |
| Component (c) | EXOLIT OP-935 <5> | — | 10.0 | 10.0 | 10.0 | 10.0 | 10.0 | — | — | — | — |
| | MEL APUR MC <6> | — | — | — | — | — | — | 10.0 | — | — | — |
| | APYRAL AOH60 <7> | — | — | — | — | — | — | — | 10.0 | — | — |
| Component (d) | TEPIC-SP <8> | — | 10.0 | 10.0 | 10.0 | 10.0 | 10.0 | 10.0 | 10.0 | — | 10.0 |
| Other components | Floren AC-2000 <9> | 1.0 | 1.0 | 1.0 | 1.0 | 1.0 | 1.0 | 1.0 | 1.0 | 1.0 | 1.0 |
| Component (d) | 1,2-bis(2-methoxy ethoxy)ethane | 100.0 | 100.0 | 100.0 | 100.0 | 100.0 | 100.0 | 100.0 | 100.0 | 100.0 | 100.0 |

*"Ex" stands for "Example"
*"Com Ex" stands for "Comparative Example".
*"BP" stands for "Black pigment having an absorptive range within the infrared range"

TABLE 2

Unit: parts by weight

| Components | Constituent ingredients of photosensitive resin composition | Example 9 | Comparative Example 3 |
|---|---|---|---|
| Component (a) | Binder polymer 1 | 42.0 | 42.0 |
| | Binder polymer 2 | — | — |
| | Binder polymer 3 | — | — |
| Component (b) | Black 6350 <1> | — | — |
| | Black 6303 <2> | — | — |
| | Paliogen Black S0084 <3> | 5.0 | — |
| Black pigment having an absorptive range within the infrared range | Carbon black M-50 <4> | — | 5.0 |
| Component (c) | EXOLIT OP-935 <5> | 20.0 | 20.0 |
| | MEL APUR MC <6> | — | — |
| | APYRAL AOH60 <7> | — | — |
| Component (d) | TEPIC-SP <8> | 10.0 | 10.0 |
| Component (e) | IRUGACURE OXE-02 <10> | 1.0 | 1.0 |
| Other components | FANCRYL FA-321M <11> | 15.0 | 15.0 |
| | Floren AC-2000 <9> | 1.0 | 1.0 |
| Component (d) | 1,2-bis(2-methoxyethoxy)ethane | 100.0 | 100.0 |

Note that <1> to <11> in Tables 1 and 2 represent the following:

<1> Product name of a black coloring agent (metal complex oxide) available from Asahi Kasei Kogyo Co., Ltd., with a wavelength range of 800 nm to 2000 nm and a reflectance of 5% or higher <2> Product name of a black coloring agent (metal complex oxide) available from Asahi Kasei Kogyo Co., Ltd., with a wavelength range of 800 nm to 2000 nm and a reflectance of 5% or higher <3> Product name of a black coloring agent (organic pigment) available from BASF Japan Ltd., with a wavelength range of 800 nm to 2000 nm and a reflectance of 5% or higher <4> Product name of a product available from Mitsubishi Chemical Corporation, with an absorptive range within a wavelength range of 800 nm to 2000 nm <5> Product name of a phosphinate available from Clariant Japan K. K., with a solubility of lower than 0.01 part by weight with respect to 100 parts by weight of 1,2-bis(2-methoxyethoxy)ethane <6> Product name of a melamine cyanurate available from BASF Japan Ltd., with a solubility of lower than 0.01 part by weight with respect to 100 parts by weight of 1,2-bis(2-methoxyethoxy)ethane <7> Product name of a boehmite aluminium hydroxide available from Naboltech GmbH, with a solubility of lower than 0.01 part by weight with respect to 100 parts by weight of 1,2-bis(2-methoxyethoxy)ethane <8> Product name of a polyfunctional epoxy resin (triglycidyl isocyanurate) available from Nissan Chemical Industries, Ltd.

<9> Product name of a butadiene defoaming agent available from Kyoeisha Chemical Co., Ltd.

<10> Product name of an oxime ester photopolymerization initiator available from BASF Japan Ltd.

<11> Product name of EO-modified bisphenol A dimethacrylate available from Hitachi Chemical Co., Ltd.

<Evaluation of Insulator Film>
(i) Electrical Insulation Reliability

On a flexible copper-clad laminate (including an electrolytic copper foil with a thickness of 12 μm and the polyimide film named Apical 25NPI available from Kaneka Corporation, the copper foil being bonded to the polyimide film with use of a polyimide adhesive), a comb-shaped pattern having a line width of 100 μm and a space width of 100 μm was prepared. The flexible copper-clad laminate was then immersed in a 10% by volume sulfuric acid aqueous solution for 1 minute, washed with pure water, and subjected to a surface treatment for the copper foil. Next, the resin composition was flow-cast and applied onto the comb-shaped pattern to form a film having a final thickness of 20 μm in the dry state, and the film was dried at 80° C. for 20 minutes. The film was then heated in an oven at 150° C. for 30 minutes to be cured. As a result, an insulator film as a test piece was prepared. In the case where the resin composition was a photosensitive resin composition, the resin composition was flow-cast and applied onto the comb-shaped pattern to form a film having a final thickness of 20 μm in the dry state, and the film was dried at 80° C. for 20 minutes. The film was then irradiated with ultraviolet light in an integral exposure amount of 300 mJ/cm² for exposure. Next, the film was subjected to spray development with use of a 1.0% by weight sodium carbonate aqueous solution (heated to 30° C.) at a discharge pressure of 1.0 kgf/mm² for 90 seconds. After the development, the resulting film was sufficiently washed with pure water, and then heated in an oven at 150° C. for 30 minutes to be cured. As a result, an insulator film as a test piece was prepared. A direct current of 100 V was applied to both ends of the test piece in an environmental testing apparatus at 85° C. and 85% RH, and the test piece was observed for a change in the insulation resistance value and an occurrence of migration, etc. The observation results are each indicated with "G" or "P" below.

G (good): 1000 hours after the start of the test, had a resistance value of not less than 10 to the 8th power and showed no occurrence of migration or formation of dendrites P (poor): 1000 hours after the start of the test, showed occurrence of migration, and/or formation of dendrites, etc.

(ii) Concealment Property

The above resin composition was flow-cast and applied onto a 25 μm polyimide film (product named 25NPI available from Kaneka Corporation) over an area of 100 mm×100 mm with use of a Baker's applicator to form a film having a final thickness of 20 μm in the dry state, and the film was dried at 80° C. for 20 minutes. The film was then heated in an oven at 150° C. for 30 minutes to be cured. As a result, an insulator film as a test piece was prepared. In the case where the resin composition was a photosensitive resin composition, the resin composition was flow-cast and applied onto the comb-shaped pattern to form a film having a final thickness of 20 μm in the dry state, and the film was dried at 80° C. for 20 minutes. The film was then irradiated with ultraviolet light in an integral exposure amount of 300 mJ/cm² for exposure. Next, the film was subjected to spray development with use of a 1.0% by weight sodium carbonate aqueous solution (heated to 30° C.) at a discharge pressure of 1.0 kgf/mm² for 90 seconds. After the development, the resulting film was sufficiently washed with pure water, and then heated in an oven at 150° C. for 30 minutes to be cured. As a result, an insulator film as a test piece was prepared. The test piece was placed on squared paper having 1 mm squares, and the squares were observed from above the test piece for evaluation of concealment property. The evaluation results are each indicated with "G" or "P" below.

G (good): The squares were invisible.

P (poor): The squares were visible.

<Preparation of Test Piece for Evaluation of Stiffener-Integrated Flexible Printed Circuit Board>

The resin composition prepared as above was flow-cast and applied onto a copper foil surface of a one-side wiring-pattern-equipped film (including an electrolytic copper foil with a thickness of 12 μm and the polyimide film named Apical 25NPI available from Kaneka Corporation, the copper foil being bonded to the polyimide film with use of an epoxy adhesive) over an area of 100 mm×100 mm with use of a Baker's applicator to form a film having a final thickness of 20 μm in the dry state. The film was dried at 80° C. for 20 minutes, and then heated in an oven at 150° C. for 30 minutes to be cured. As a result, an insulator film of the resin composition was formed on the one-side wiring-pattern-equipped film to prepare a flexible printed circuit board.

In the case where the resin composition was a photosensitive resin composition, the photosensitive resin composition was flow-cast and applied onto a copper foil surface of a one-side wiring-pattern-equipped film (including an electrolytic copper foil with a thickness of 12 μm and the polyimide film named Apical 25NPI available from Kaneka Corporation, the copper foil being bonded to the polyimide film with use of an epoxy adhesive) over an area of 100 mm×100 mm with use of a Baker's applicator to form a film having a final thickness of 20 μm in the dry state, and the film was dried at 80° C. for 20 minutes. The film was then irradiated with ultraviolet light in an integral exposure amount of 300 mJ/cm² for exposure. Next, the film was subjected to spray development with use of a 1.0% by weight sodium carbonate aqueous solution (heated to 30° C.) at a discharge pressure of 1.0 kgf/mm² for 90 seconds. After the development, the resulting film was sufficiently washed with pure water, and then heated in an oven at 150° C. for 30 minutes to be cured. As a result, an insulator film of the resin composition was formed on the one-side wiring-pattern-equipped film to prepare a FPC.

Next, a thermosetting adhesive (product named Pyralux LF0100 available from Du Pont Kabushiki Kaisha) was temporarily pressure-bonded to a polyimide film (the product named Apical 125NPI available from Kaneka Corporation) serving as a stiffener with use of a heat-roll laminator at 185° C. to prepare a layered product 1. Then, a surface of the insulator film for the FPC prepared as above was pressure-bonded by thermal press at 165° C./90 min to the thermosetting adhesive surface of the layered product 1 to prepare a test piece for evaluation of the stiffener-integrated FPC.

<Evaluation of Stiffener-Integrated FPC>

The stiffener-integrated flexible printed circuit board prepared was evaluated on the items below. Tables 3 and 4 show the results of the evaluation.

(iii) Adhesiveness to Stiffener

The test piece prepared as described under <Preparation of Test Piece for Evaluation of Stiffener-Integrated Flexible Printed Circuit Board> above was evaluated through a cross-cut tape method in conformity to JIS K5400. The evaluation results are each indicated with "G", "F", or "P" below.

G (good): Showed no peel through the cross-cut tape method

F (fair): 95% or more of the squares remained

P (poor): Less than 80% of the squares remained (iV) Reflow Heat Resistance

The test piece prepared as described under <Preparation of Test Piece for Evaluation of Stiffener-Integrated Flexible Printed Circuit Board> above was observed for its appearance after a reflow process at 260° C. with a peak top of 260° C.×20 sec. The observation results are each indicated with "G" or "P" below.

G (good): Showed no change in appearance after the test

P (poor): Showed swelling at any lamination interface of the test piece after the test

TABLE 3

| Evaluation items | Ex 1 | Ex 2 | Ex 3 | Ex 4 | Ex 5 | Ex 6 | Ex 7 | Ex 8 | Com Ex 1 | Com Ex 2 |
|---|---|---|---|---|---|---|---|---|---|---|
| Electrical insulation reliability | G | G | G | G | G | G | G | G | P | P |
| Concealment property | G | G | G | G | G | G | G | G | G | G |
| Adhesiveness to the stiffener | F | G | G | G | G | G | G | G | P | P |

TABLE 3-continued

| Evaluation items | Ex 1 | Ex 2 | Ex 3 | Ex 4 | Ex 5 | Ex 6 | Ex 7 | Ex 8 | Com Ex 1 | Com Ex 2 |
|---|---|---|---|---|---|---|---|---|---|---|
| Reflow heat resistance | F | G | G | G | G | G | G | G | P | P |

TABLE 4

| Evaluation items | Example 9 | Comparative Example 3 |
|---|---|---|
| Electrical insulation reliability | G | P |
| Concealment property | G | G |
| Adhesiveness to the stiffener | G | P |
| Reflow heat resistance | G | P |

The present invention provides a stiffener-integrated flexible printed circuit board including: (A) a stiffener; (B) a thermosetting adhesive; (C) an insulator film; and (D) a wiring-pattern-equipped film, (A) the stiffener, (B) the thermosetting adhesive, (C) the insulator film, and (D) the wiring-pattern-equipped film being laminated in this order, (C) the insulator film containing at least (a) a binder polymer and (b) a black coloring agent having a reflective range within an infrared range. (C) The insulator film preferably contains (c) a flame retarder substantially undissolvable in an organic solvent. Further, (C) the insulator film preferably includes a resin composition containing (d) a thermosetting resin. In addition, (C) the insulator film more preferably includes a photosensitive resin composition containing (e) a photopolymerization initiator.

The present invention is not limited to the description of the embodiments above, but may be altered in various ways by a skilled person within the scope of the claims. Any embodiment based on a proper combination of technical means disclosed in different embodiments is also encompassed in the technical scope of the present invention. Further, combining technical means disclosed in different embodiments can provide a new technical feature.

INDUSTRIAL APPLICABILITY

A stiffener-integrated flexible printed circuit board of the present invention is usable for a circuit board or the like of any of various electronic devices.

REFERENCE SIGNS LIST 1 base film
2 wiring pattern
3 wiring-pattern-equipped film
4 insulator film
5 flexible printed circuit board
6 stiffener
7 thermosetting adhesive

The invention claimed is:

1. A stiffener-inegrated flexible printed circuit board, comprising:
   (A) a stiffener selected from a polyimide having a thickness of 75 µm to 225 µm, a paper phenol plate, and a glass epoxy plate;
   (B) a thermosetting adhesive;
   (C) an insulator film; and
   (D) a wiring-pattern-equipped film,
   (A) the stiffener, (B) the thermosetting adhesive, (C) the insulator film, and (D) the wiring-pattern-equipped film being laminated in this order,
   (C) the insulator film being made of components comprising at least (a) a binder polymer that is a polyurethane resin and (b) black coloring agent having a reflective range within an infrared range, the black coloring agent is at least one compound selected from the group consisting of a metal complex oxide, an aniline compound, and an anthraquinone compound,
   wherein (C) the insulator film is additionally made of component (c) a flame retarder that is substantially undissolvable in an organic solvent, the flame retarder being selected from at least one member of the group consisting of a phosphorus compound, a melamine compound, and a metalhydroxide.

2. The stiffener-integrated flexible printed circuit board according to claim 1,
   wherein
   (C) the insulator film is additionally made of component (d) a thermosetting resin.

3. The stiffener-integrated flexible printed circuit board according to claim 1,
   wherein
   (C) the insulator film is additionally made of a photosensitive resin composition component and component (e) a photopolymerization initiator.

4. The stiffener-integrated flexible printed circuit board according to claim 1, wherein
   the metal complex oxide is selected from the group consisting of an iron-manganese complex oxide, an iron-cobalt-chrome complex oxide, an iron-chrome-manganese complex oxide, a copper-chrome complex oxide, and a copper-manganese complex oxide.

5. The stiffener-integrated flexible printed circuit board according to claim 1, wherein the stiffener is a polyimide film having a thickness of 75 µm to 225 µm.

6. The stiffener-integrated flexible printed circuit board according to claim 1, wherein the black coloring agent is a metal complex oxide.

* * * * *

UNITED STATES PATENT AND TRADEMARK OFFICE
CERTIFICATE OF CORRECTION

Page 1 of 1

PATENT NO.        : 10,292,262 B2
APPLICATION NO.   : 14/414839
DATED             : May 14, 2019
INVENTOR(S)       : Masayoshi Kido and Yoshihide Sekito It is certified that error appears in the above-identified patent and that said Letters Patent is hereby corrected as shown below:

In the Claims

Column 36, Lines 7-8:
"(A) a stiffener selected from a polyimide having a thick-"
Should be:
– (A) a stiffener selected from a polyimide film having a thick- –

Column 36, Lines 46:
"oxide, and a copper-manganese complex oxide."
Should be:
– oxide, and a copper-chrome-manganese complex oxide. –

Signed and Sealed this
Twenty-eighth Day of January, 2020

Andrei Iancu
*Director of the United States Patent and Trademark Office*